United States Patent [19]

Kramer

[11] Patent Number: 4,991,218

[45] **Date of Patent: * Feb. 5, 1991**

[54] DIGITAL SIGNAL PROCESSOR FOR PROVIDING TIMBRAL CHANGE IN ARBITRARY AUDIO AND DYNAMICALLY CONTROLLED STORED DIGITAL AUDIO SIGNALS

[75] Inventor: Gregory Kramer, Garrison, N.Y.

[73] Assignee: Yield Securities, Inc., Garrison, N.Y.

[ * ] Notice: The portion of the term of this patent subsequent to Sep. 19, 2006 has been disclaimed.

[21] Appl. No.: 398,238

[22] Filed: Aug. 24, 1989

Related U.S. Application Data

[63] Continuation-in-part of Ser. No. 141,631, Jan. 7, 1988, Pat. No. 4,868,869.

[51] Int. Cl.[5] .............................................. H03G 3/00
[52] U.S. Cl. ........................................ 381/61; 84/622
[58] Field of Search ............................ 381/61; 84/622

[56] References Cited

U.S. PATENT DOCUMENTS 4,569,268 2/1986 Futamase et al. ..................... 381/63
4,868,869 9/1989 Kramer ................................ 381/61

OTHER PUBLICATIONS

Turbosynth, Software by Digidesign (Date Unknown).

*Primary Examiner*—Forester W. Isen
*Attorney, Agent, or Firm*—Brooks Haidt Haffner & Delahunty

[57] ABSTRACT

A digital audio signal processing technique in which the harmonic content of the output signal varies with the amplitude of an input signal. The preferred embodiment includes an analog to digital converter with sample and hold, a digital signal memory with playback control apparatus, timing circuits, a RAM look-up table to perform non-linear transformation and finally a digital to analog converter. The input signal, which can be an arbitrary audio signal or a digital signal representative of such a signal, is modified by a non-linear transformation means and outputted for reproduction in audible form or stored for subsequent processing.

25 Claims, 23 Drawing Sheets

DIGITAL SIGNAL PROCESSOR FOR PROVIDING TIMBRAL CHANGE IN ARBITRARY AUDIO AND DYNAMICALLY CONTROLLED STORED DIGITAL AUDIO SIGNALS

CROSS REFERENCE TO RELATED APPLICATION

This application is a continuation-in-part of U.S. patent application Ser. No. 07/141,631, filed Jan. 7, 1988 now U.S. Pat. No. 4,868,869.

BACKGROUND OF THE INVENTION

1. Field of the Invention

This invention generally relates to the field of electronic music and audio signal processing and, particularly, to a digital audio signal processing technique for providing timbral change in arbitrary audio input signals and stored complex, dynamically controlled, time-varying digital signals as a function of the amplitude of the signal being processed.

2. Description of the Prior Art

In the field of electronic music and audio recording it has long been an ambition to achieve two goals: Music that is synthesized or recorded with maximum realism and music that selectively includes special sounds and effects created by electronic and studio techniques. To achieve these goals, electronic musical instruments for imitating acoustic instruments (realism) and creating new sounds (effects) have proliferated. Signal processors have been developed to make these electronic instruments and recordings of any instruments sound more convincing and to extend the spectral vocabularies of these instruments and recordings.

While considerable headway has been made in various synthesis techniques, including analog synthesis using oscillators, filters, etc., and frequency modulation synthesis, the greatest realism has been attained by the technique of digitally recording small segments of sound, colloquially known as samples, into a digital signal memory for playback by a keyboard or other controller. This sampling technique yields some very realistic sounds. However, sampling has one very significant drawback: Unlike acoustic phenomena, the timbre of the sound is the same at all playback amplitudes. This results in uninteresting sounds that are less complex, controllable and expressive than the acoustic instruments they imitate. Similar problems occur to different degrees with synthesis techniques.

To increase the realism of synthesized music, a number of signal processing techniques have been employed. Most of these processes, such as reverberation, were originally developed for the alteration of acoustic sounds during the recording process. When applied to synthesized waveforms, they helped increase the sonic complexity and made them more natural sounding. However, none of the existing devices are able to relate timbral variation to changes in loudness with any flexibility. This relationship is well understood to be critical to the accurate emulation of acoustic phenomena. This invention provides a means of relating these two parameters, the processed result being more realistic and interesting than the unprocessed signal which has the same timbre at all input amplitudes.

A number of signal processing techniques have been developed for achieving greater variety, control and special effects in the sound generating and recording process. In addition to the realism mentioned above, these signal processors have sought to extend the spectrum of available sounds in interesting ways. Also, to a large extent many of the dynamic techniques of signal processing have been well investigated for special effects, including time/amplitude, time/frequency, and input/output amplitude. These processes include, reverberators, filters, compressors and so on. None of these devices have the property of relating the amplitude of the input to the timbre of the output in such a way as to add musically useful and controllable harmonics to the signal being processed.

There are three areas of prior art that have direct bearing upon the invention: (1) The use of non-linear transformation in non-real-time mainframe computer synthesis, (2) the use of non-linear transformation in real-time sine-wave based hardware additive synthesis, and (3) the generation of new samples by using pre-existing samples as a non-dynamic input to a non-linear transformation means. Non-linear transformation of audio for music synthesis, also known as waveshaping, via the use of look-up tables has been in common use in universities worldwide since the mid-1970's. The seminal work in this field was done by Marc LeBrun and Daniel Arfib and published in the *Journal of the Audio Engineering Society*, V. 27, No. 4 and V. 27 No. 10. The work described in these writings gives an overview of waveshaping and makes extensive use of Chebyshev polynominals. The work done in this area consists primarily of the distortion of sine waves in order to achieve new timbres in music synthesis. There was a particular focus on brass instrumental sounds, as evidenced by the work of James Beauchamp, (*Computer Music Journal* V. 3 No. 3 Sept. 3, 1979) and others.

Hardware synthesis exploiting the non-linearity of analog components has been employed in music to distort waveforms for many years. Research in this area was done by Richard Schaefer in 1970 and 1971 and published in the *Journal of the Audio Engineering Society*, V. 18, No. 4 and V. 19, No. 7. In this literature he discusses the equations employed to achieve predictable harmonic results when synthesizing sound. With a sine wave input and using Chebyshev polynomials to determine the non-linear components used on the output circuitry, different waveforms were synthesized for electronic organs. More recently, Ralph Deutsch has employed hardware lookup tables as a real-time variation of the earlier mainframe synthesis techniques (U.S. Pat. Nos. 4,300,432 and 4,273,018). The Deutsch patents differ from the work by LeBrun, Arfib et al only inasmuch as multiple sine waves, orthogonal functions, or piecewise linear functions rather than single sine waves are input into the look-up table to achieve the synthesis of the desired output.

One limitation of the above mentioned uses of non-linear transformation are their employment in synthesis environments that did not allow real-time arbitrary audio input. By embedding the look-up tables or non-linear analog components in the synthesis circuitry or software, distortion of audio signals coming from outside the synthesis system was rendered impossible.

One advantage of this invention lies in its capacity to accept and transform arbitrary real-time audio input or a stream of digital signals which is representative of such audio input. This opens up the possibility of performing non-linear transformation upon acoustic signals. Also, original or modified audio signals produced by any synthesis technique can be processed by a waveshaper. It also enables the insertion of the waveshaping circuitry into various signal processor configurations. Thus, it can be included as part of the recording/mixdown process before or after other signal processors, such as compressors, reverberators and filters.

The first two techniques described both possess another limitation in that they describe tone generators based on additive synthesis of sine or other elementary functions. The signals to be transformed are static, computed, periodic waveforms which are processed to add time varying timbral qualities. These computed-function based inputs comprise a limited class of periodic waveforms and hence produce a narrow range of sonic qualities. The more interesting case of devices which include digital signal memories (e.g. samplers) for storing complex, time-varying audio data is not addressed or implied in either of these techniques.

While some of the prior art employs memory to store signals to be transformed, these devices store periodic, elementary functions (e.g. sine waves). It is possible to calculate the values of these functions from point to point in hardware but it is simpler and more economical to store pre-computed functions in memory. This art does not exploit the fundamental property of memory to store arbitrary complex, time-varying signals.

When these complex, time-varying stored digital waveforms are non-linearly transformed, a new class of musically useful timbres is produced. Since the digital signal memory can store essentially arbitrary audio signals, the operation of the transform memory is identical to that described above for arbitrary input with the added advantage that sonic events can be conveniently stored, selected, triggered and controlled, as is the case with today's conventional samplers.

There are several advantages to including the transformation memory within an architecture that includes a digital signal memory, such as a sampler. One advantage is that a single transform memory can be applied to multiple notes and/or waveforms through time-multiplexing of the table. This eliminates the undesirable mixing effects that occur when multiple notes are non-linearly processed. It is also possible to eliminate mixing by dedicating a separate physical transform memory to each active note, but this approach is inherently more costly than multiplexing a single memory. A further advantage of the invention is that the addition of a transform memory provides a means for economically extending the available set of sounds by applying various timbral modifications to each of the original sounds. Thus, for example, a set of 16 sampled sounds may provide 48 different sounds with the addition of two very different transform memories—the original 16 plus 16 of each transformed set.

The third technique described above, that of generating new samples by using pre-existing samples as a non-dynamic input to a non-linear transformation means, has been implemented in a software product called Turbosynth by the Digidesign Company. Turbosynth is designed to create new samples for musical use by using one or more of several techniques. These include synthesizing sounds and processing pre-existing samples and synthesized waveforms with a number of different tools, such as volume envelopes, mixers, filters, etc., which are executed in software on a Macintosh computer. Pertinent to this invention, non-linear transformation, or waveshaping, is one of the tools included. Turbosynth is typically used to create new samples which are then exported to the memory of a sampling synthesizer for performance.

By using the waveshaping tool in Turbosynth, distortion of arbitrary audio input is possible in as far as the arbitrary audio input is not real-time and is static with regard to any external control parameters. Only samples, or finite segments of stored digital audio, may be processed. Although the waveform of the sample may vary in time, unless it or some other aspect of the architecture is recalculated, none of its parameters vary; the data input to the waveshaper is always exactly the same. The waveshaping operation(s) is/are applied to the waveform only once, not continuously. It is thus limited in that dynamic timbral variation as a function of real-time parameters such as key velocity, cannot be achieved. It is possible to dynamically vary the amplitude and other parameters of the sample playback after the sample has been exported to the sampling synthesizer. However, at this point, the waveshaping process has been completed and the dynamic changes have no effect upon the timbre of the sound.

To accelerate the recalculation process, Digidesign offers a hardware product called the Sound Accelerator. With this device, it is possible to preview the changes made to a sound created in Turbosynth in real time by playing notes on a music keyboard attached to the Macintosh. However, while different pitches may be input to the waveshaper, no other dynamic parameter variations can be affected. The waveshaper is thus used as a tool for generating new, fixed timbres and not, like the present invention, as a processor for achieving dynamic timbral variation.

Structurally, Turbosynth, as it may relate to the present invention, can be thought of as shown in FIG. 20. In this example, only the waveshaper tool is employed. A digital audio sample from a sampler 200 is transferred to digital signal memory file 130*a* in the Macintosh computer 201. It is then processed via the waveshaper tool, which is a look up table 103. The output of the look up table is a second digital signal memory file 130*b* which may optionally be previewed using the Macintosh D/A converter 104 and speaker 125. If the user wishes to use the sound for performance, it would be transferred back to the sampler 200. The transformed sound is now fixed in the sampler's memory and when the instrument is played, all RMS amplitude changes, filter changes, and son on, are performed upon the new, fixed timbre.

The crucial limitation of this structure is that it places the look up table prior to the performance control mechanism of the sampler. As described above, this precludes the most powerful aspect of waveshaping, i.e. its ability to produce not one new timbre but a continuum of new timbres as a function of input amplitude.

SUMMARY OF THE INVENTION

The present invention is a device for digitally processing analog and/or digital audio signals in real time and for processing dynamically controlled digital audio signal memory of time-varying complex waveforms. There are two normal modes of operation, either or both of which can be employed in a given implementation. They differ only in that one processes digital audio samples from an A/D converter or direct digital audio input and the other processes stored digitized audio samples. In either case, these samples are used sequentially to address a look-up table stored in a dedicated memory array. Typically, these addresses will range from 0 to $2^N-1$, where N is the number of bits provided by the A-D convertor. The values stored at these addresses are sequentially read out of the look-up table, providing a series of output audio samples, corresponding to the incoming samples after modification by the table-lookup operation. These output samples will range from 0 to $2^M-1$ where M is the width in bits of the data entries in the lookup table. These output samples are then stored or converted back into analog form via a D/A convertor. A post-filter may be used to smooth out switching transients from the convertor. The resulting processed audio waveform can then be output to an amplifier and speaker.

A host computer interface, which facilitates entering and editing the values stored in the table via software, is also outlined. In this mode, the address to the table is selected from the address bus of the computer, rather than the output of the A/D convertor. The data from the array is attached to the computer's data bus, allowing the host to both read and write locations in the array.

Alternatively, the invention may be embedded in a system that includes a microprocessor for various functions including digital signal memory playback management, real-time parameter control, operator interfaces, etc. In this case, the microprocessor may also be used to manage the transform memory tables. This includes such functions as table storage and retrieval and table editing.

In an alternative embodiment of the invention, the table-lookup operation is performed by a special-purpose digital signal processor (DSP) chip. Here, the digital audio samples are read directly by the signal processor. A program module running in the processor causes it to sequentially use the values read as addresses into a table stored somewhere in it's program memory. The results of this lookup operation are then output by the signal processor to a D/A convertor and post-filter in a manner identical to that outlined above. Table-modification software can be written to run directly on the DSP processor, or on a microprocessor, assuming the DSP program memory is accessible to the microprocessor.

This alternative embodiment could either be a stand-alone signal processor or integrated into the sample output processing routines of a DSP based sample playback system.

DESCRIPTION OF THE PREFERRED EMBODIMENT

Figure 1:
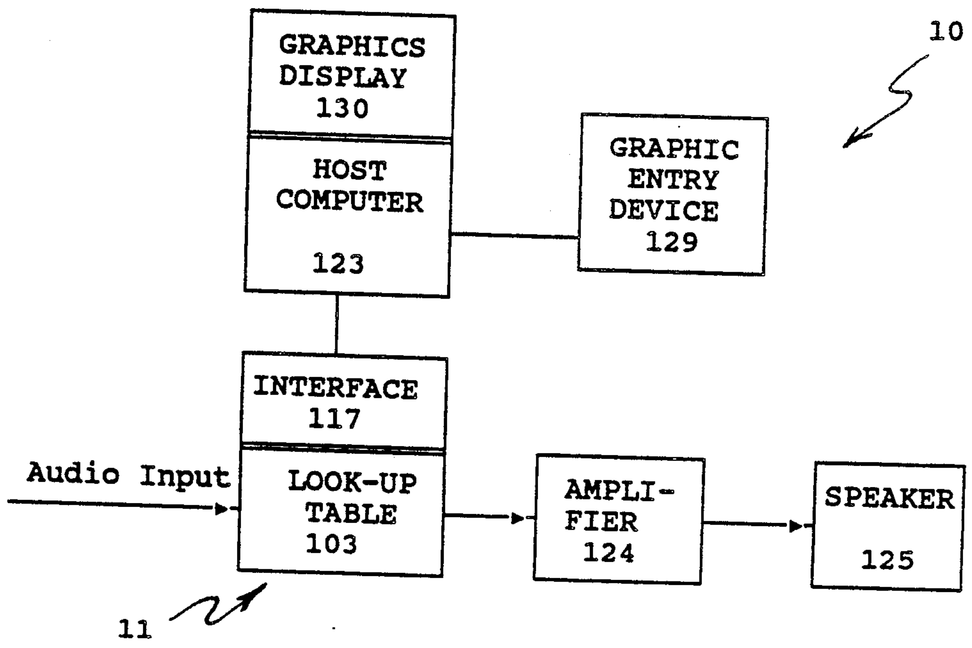
FIG. 1 is a diagram of a system incorporating the invention, including the host computer and attached graphic entry and display devices.
Figure 2A:
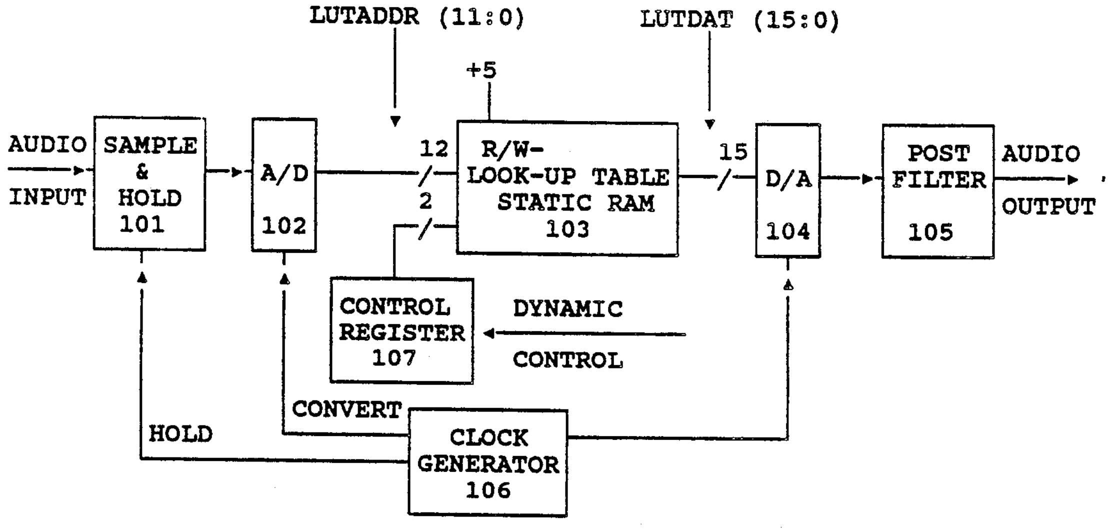
FIG. 2*a* is a block diagram of a preferred embodiment of the invention.
Figure 2B:
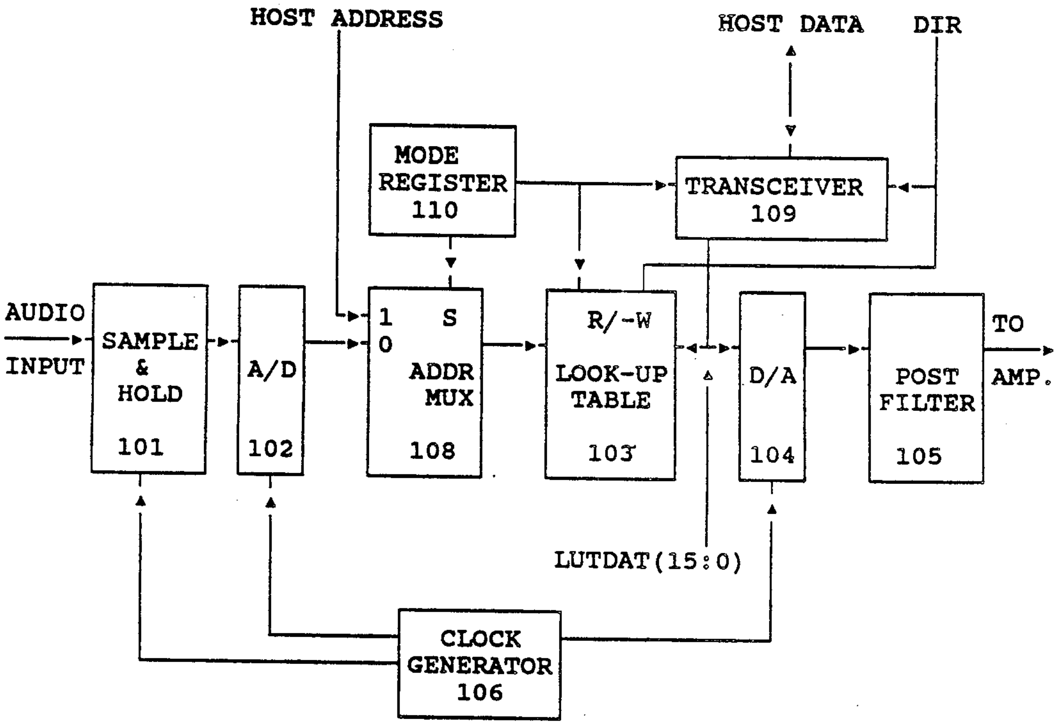
FIG. 2*b* shows the embodiment of FIG. 2*a* as interfaced to a host computer.
Figure 3A:
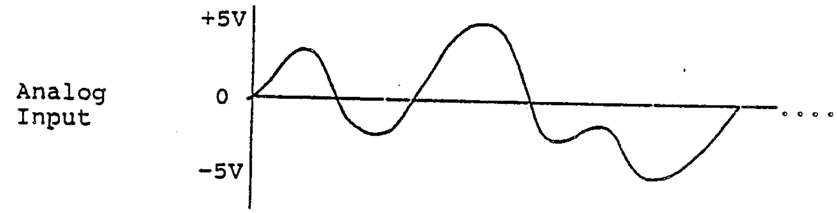
FIGS. 3*a*–3*g* are timing diagrams useful in explaining the normal operational mode of the system shown in FIGS. 2*a* and 2*b*.
Figure 3B:
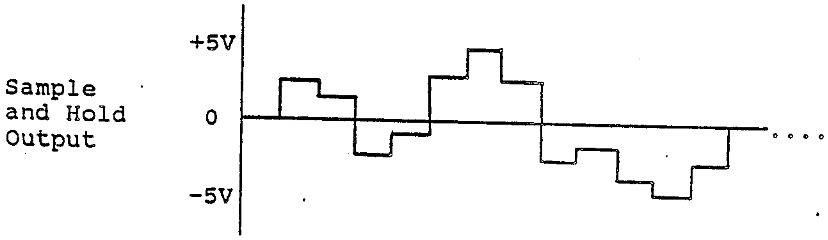
Figure 3C:
Figure 3D:
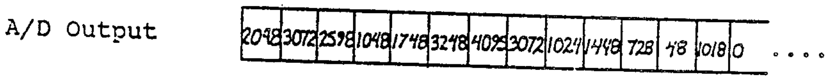
Figure 3E:
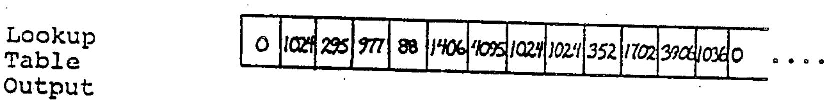
Figure 3F:
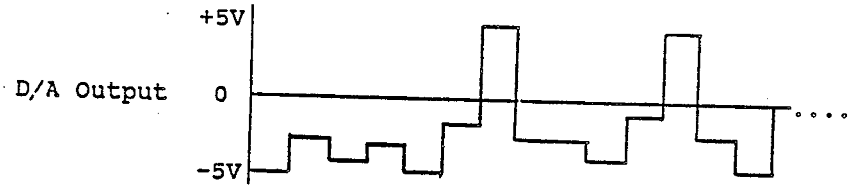
Figure 3G:
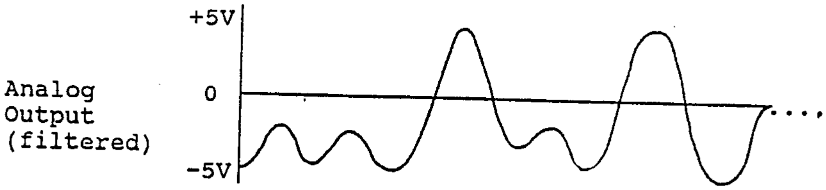

Introduction: In order to more fully understand this invention, the following definitions and nomenclatures should be understood.

1. Stand-Alone Signal Processor and On-Board Signal Processing: This patent teaches the use of a lookup table (LUT) to perform point-to-point translation as a function of the specific digital values of the instantaneous amplitudes on arbitrary audio input. FIGS. 1–14 describe the fundamentals of this technique and emphasize its application to acoustic signals that have been converted into digital samples which are then processed by the LUT. This implementation does not encompass the use of digital memory means for storage of these signals prior to the LUT processing. FIGS. 15–19 explicitly describe the use of a dynamically controllable digital memory means for storing digital samples prior to their LUT processing.

It should be understood, however, that the techniques described in FIGS. 1–14 may be applied as easily to samples coming from a digital signal memory as to samples coming from an analog to digital converter or a digital audio source such as a CD player with a digital output. In the former case, the LUT is used as an onboard signal processing technique. In the latter case, the LUT is used as a stand-alone signal processor. A typical application of the former would be a sampler with a LUT at the output. A typical application of the latter would be a unit with an input jack, A/D and LUT processing circuitry, and an output jack.

2. Simple, Computed, Periodic Waveforms and Complex, Time-Varying Digital Signals: Lookup tables are used in prior art exclusively to process either simple, computed, periodic waveforms or complex but static waveforms that are not responsive to any external parameters. This patent teaches the use of a lookup table to process complex or arbitrary, time-varying digital signals that may be dynamically controlled. It is important to understand the fundamental differences between simple and complex signals. Furthermore, it is important to understand the implications of LUT processing of these complex groups of sounds, especially with regard to dynamic parameter control.

As mentioned in the Description of Prior Art, lookup tables have been used to process sine waves, giving these elementary waveforms a more complex timbre that varies with amplitude. The work of LeBrun, Arfib and Beauchamp are all based exclusively on sine waves. The later work of Ralph Deutsch extended this technique to include the use of loudness scaling on the sine waves prior to the LUT to provide more control over the spectrum of the processed result. The Deutsch patents also describe the use of piecewise linear or orthogonal functions as inputs to the LUT. Orthogonal means functions that have a specific relationship to each other such that their inner product is equal to zero over some interval. For example, sine and cosine are orthogonal, since $$\int_{-\pi}^{\pi} \sin(ax)\cos(ax)\,dx = 0.$$

In these cases, the prior art refers to a limited class of simple, computed, periodic waveforms. That is, a single cycle of a waveform is computed, stored in digital memory, and repeatedly read out from that memory at a rate corresponding to the frequency of the sound. The waveform never existed as an acoustic sound nor is it a reconstruction of an acoustic sound. Its spectral content, prior to processing, does not vary in time. This prior art does not refer to or exploit the capacity of digital signal memory to store arbitrary audio. For example, the sine waves used are simple, static functions which are stored in read only memories to avoid the need for repeatedly computing the sine values.

For purposes of this application, a simple signal means a computed, periodic waveform. On the other hand, for purposes of this application, a complex signal means an arbitrary audio signal that results from acoustic sounds or derivatives thereof.

The complex, time-varying waveform being processed can be understood to include audio signals digitized from the real world, (i.e. formerly acoustic signals) whether they are: (a) stored in a sample memory prior to being processed, (b) reconstructions of such signals from compressed data, or (c) real-time audio data processed immediately as it is output (i.e. no storage). The last-mentioned possibility (c) refers to both the output of an A/D converter and digital audio data from any device with a digital audio output. The digital signal memory with on-board processing implementation is essentially identical to the stand-alone signal processor implementation with the primary difference being that the audio signal is stored prior to processing.

3. Dynamically Controllable Complex Digital Audio: This is intended to be complex digital audio in which at least one parameter, RMS amplitude, can be dynamically controlled in real-time.

As this complex audio is processed by the lookup table, the effect of the transformation changes as the input signal's dynamically controllable parameters are varied. Dynamically controllable variables that are useful in the context of waveshaping include RMS amplitude, spectral content and DC shift. Examples which utilize RMS amplitude variation include simple volume, tremolo, and dynamically controlled enveloping. Examples of spectral content that may be dynamically controlled include filter cutoffs, filter resonance, frequency or amplitude modulation depth, the relative mix of various components of the sound, and waveform looping points. DC shift simply refers to the DC or average value of the waveform.

Of these parameters, RMS amplitude is of particular importance. Because the LUT alters the point to point amplitude of the audio input, a change in the RMS amplitude will effect which locations in the LUT are accessed and so what the timbre is of the output signal. As described in the Background of the Invention, this dynamic relationship between amplitude and timbre is a key factor in the usefulness of this invention.

All of these parameters may be controlled by any of several means. These include velocity of a key depression, pressure on a key after it is depressed, breath control, position information, and the values of any number of potentiometers, (e.g. such as pedals, sliders and knobs).

When these or any other controls are applied to any of the above mentioned sonic variables, an expressive musical performance system can be realized. When the output of such a system is further processed using non-linear transformation, then several important acoustic relationships, most significantly that between timbre and amplitude, can be effectively emulated.

The present invention teaches the use of a LUT as a signal processing device, through which arbitrary audio input may be processed. In the context of digital signal memory, this input refers to a dynamically controllable complex, time-varying digital signal. This invention, therefore, is not intended to cover the use of simple, computed, periodic waveforms as audio input for the LUT processing. Furthermore it is not intended to cover cases where non-dynamically controllable, stored, complex waveforms are processed by passing the waveform values through a LUT, creating a new waveform for future playback.

As previously mentioned, the application of the described LUT processing to arbitrary audio input produces a new class of sounds and a new dimension of expressive control over spectral content. The specific effect the LUT has upon the input will depend largely on the table itself. The effect of the LUT processing can range from a slight addition of harmonics to the onset transients of a sound (typically the loudest part of a sound), to a great amount of distortion of the input at all input amplitudes, where the distortion may change in character as the input amplitude changes. This technique does not exhibit the predictability of using sine waves and Chebyshev polynomials. However, experimentation with already complex waveforms has shown that a musically useful and hitherto unexplored class of sounds is produced. The usefulness of this technique is greatly enhanced by the user's capacity to dynamically control the amplitude of the input in real-time performance.

Basic Signal Processor

FIG. 1 shows a computer system incorporating the invention. The look-up table 103 is connected to the host computer 123 via the interface circuit 117 to facilitate the creation of tables. The graphic entry device 129 may be used to facilitate table creation and modification. The output section is simplified to show how the processed audio output is amplified by amplifier 124 and output through speaker 125.

In FIG. *2a*, arbitrary analog audio signals are input to the processor, where they are first processed by a sample-and-hold device 101. This processing is necessary in order to limit the distortion introduced by the successive approximation technique employed by the A/D convertor 102. The HOLD signal from a clock or timing generator 106, causes the instantaneous voltage at the input to the Sample-and-hold to be held at a constant level throughout the duration of the HOLD pulse. When the HOLD signal returns to the low (SAMPLE) state, the output level is updated to reflect the current voltage at the input to the device. (refer to FIGS. *3a, b,* and *c*).

Concurrently with the HOLD pulse, a CONVERT pulse is sent to the A/D convertor 102. This will cause the voltage being held at the output of the sample and hold to be digitized, producing a 12-bit result, LUTADDR(11:0), (lookup table address bits 11 through 0) at the output. This value ranges from 0 for the most negative input voltages, to 4095 for the most positive input voltages, with 2048 representing a 0 volt input. The value so produced will remain at the output until the next CONVERT pulse is received 20 μsec later.

The 12-bit value from the A/D is used to address an array of 4 8K by 8 static RAMs, 103. The RAMs are organized in 2 banks of 2, each bank yielding 8K 16-bit words of storage. Since the total capacity of the array is 16K words while the address from the A/D is only 12 bits (representing a 4K address space), there can exist four independent tables (2 banks of 2 tables each) in the array at any given time. The selection of one table from 4 is performed using a 2 bit control register (107 in FIG. *2a*). This control register 107 can either be modified directly by the user via switches or some other real-time dynamic control, or through control of a host computer. The control register provides address bits LUTADDR(13:12), which are concatenated with bits LUTADDR(11:0) from the A/D.

In use, the static RAM's are always held in the READ state, since the Read/-Write inputs are always held high. Hence the locations addressed by the digitized audio are constantly output on the data lines LUTDAT(15:0).

FIG. *3d* illustrates a typical sequence of A/D values where the 2 control register bits are taken to be 00 for simplicity. The contents of the table represent a one-to-one mapping of input values (address) to output values (data stored in those addresses). For one arbitrary non-linear mapping function in RAM, the sequence of output values, LUTDAT(15:0), might be as shown in FIG. *3e*.

The 16-bit value output from the RAM array is input to a Digital to Analog convertor 104. Input values are converted to voltages as depicted in FIG. *3f*. An input of 0 corresponds to the most negative voltage while an input of 65535 corresponds to the most positive.

Since the voltages from the convertor occupy discrete levels and may contain DAC (Digital to Analog Converter) switching transients, it is necessary to perform some post-filtering in order to reduce any quantization or 'glitch' noise introduced. This is achieved using a seventh-order switched capacitor lowpass filter 105 (e.g. the RIFA PBA 3265).

The smoothed output, as shown in FIG. *3g*, can then be sent to the audio output of the device.

Chebyshev Polynomials

Given the architecture outlined above, the question arises as to what data should be used as the mapping function. Research into this question has been done (by Arfib, LeBrun, Beauchamp) in the area of mainframe synthesis using sinewave inputs. Throughout most of this work a particular class of polynomials, Chebyshev Polynomials, have been seen to exhibit interesting musical properties.

We shall denote this class of polynomials as $T_n(x)$, where $T_n$ is the nth order Chebyshev polynomial. These polynomials have the property that $$T_n(\cos(x)) = \cos(nx).$$

In practical terms, if a sinewave of frequency 'X' Hz and unit amplitude is used as an argument to a function $T_n(x)$, a sinewave of frequency n*X will result. A simple example can be derived from a trigonometric identity that states:

$$\begin{aligned}\cos(2x) &= \cos^2(x) - \sin^2(x) \\ &= 2\cos^2(x) - (\sin^2(x) + \cos^2(x)) \\ &= 2\cos^2(x) - 1.\end{aligned}$$

Therefore, $$T_2(x) = 2x - 1.$$

The recursive formula $$T_{n+1} = 2 \times T_n(x) - T_{n-1}(x)$$

can be used to find any of the Chebyshev polynomials given the order, n. By using a weighted sum of these polynomials, it is possible to transform a sinewave input into any arbitrary combination of that frequency and it's harmonics.

When the input is not purely sinusoidal, but is rather an arbitrary audio waveform, the effect of the polynomial is more difficult to determine analytically, since the equations are inherently nonlinear. From a practical standpoint, higher order polynomials add progressively higher harmonics to the audio input.

Figure 4:
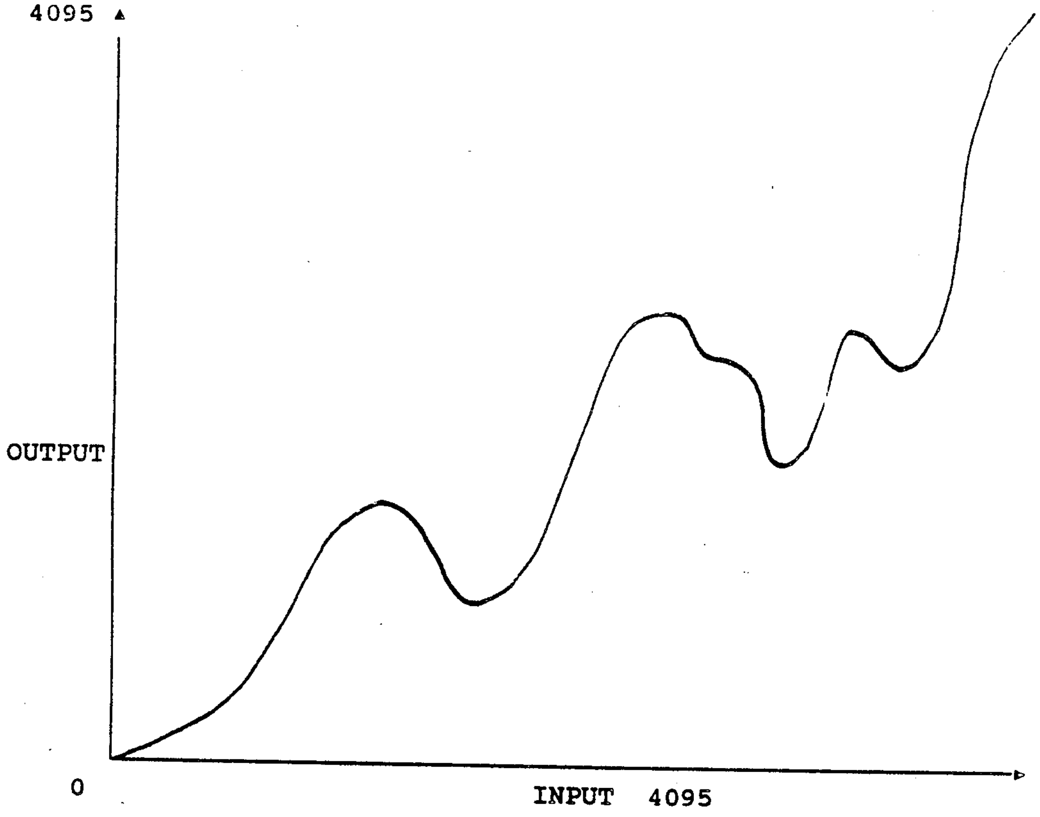
FIG. 4 is a graphical representation of a typical set of non-linear table values.

FIG. 4 illustrates a typical set of table values generated using the Chebyshev formulae. Additional flexibility in determining table values may be obtained by using various building blocks, such as line segments either calculated or drawn free-hand with the graphic entry device, sinewave segments, splines, arbitrary polynomials and pseudo-random numbers and assembling these segments into the final table. Interpolation comprising 2nd or higher-order curve fitting techniques may be employed to smooth the resultant values.

Host Computer Interface

In order to experiment with various tables, an interface to a host computer is desirable. This can be accomplished by mapping the LUT into the host computer's memory space using the circuit described in FIG. 2*b*. Here, a 12-bit 2-1 multiplexor 108 selects the address input to the RAM array from one of two buses, depending on the mode register 110. If this register is set (program mode), the address is taken from the host computer's address bus as opposed to the 12-bit output of the A/D convertor.

It is also necessary to provide a data interface to the host computer. This is accomplished by adding a bidirectional data buffer (Transceiver 109) and controlling the read/-write inputs to the RAMs. In program mode, the R/-W line is controlled by the host's DIR command line. The data buffer is also controlled so that when a bus read takes place, data is driven from the RAMs to the host data bus. At all other times, data is driven from the host data bus to the RAM data inputs. Of course, when program mode is not enabled (register 112=0), the data buffer will be disabled, the R/-W input to the RAMs will be held high, and the A/D will drive the address lines, as outlined in the original system.

Various peripheral devices can be added to the host computer to facilitate table editing operations. These include high-resolution graphics displays, and pointing devices such as a mouse, tablet or touch screen.

Alternate Embodiment

Figure 5:
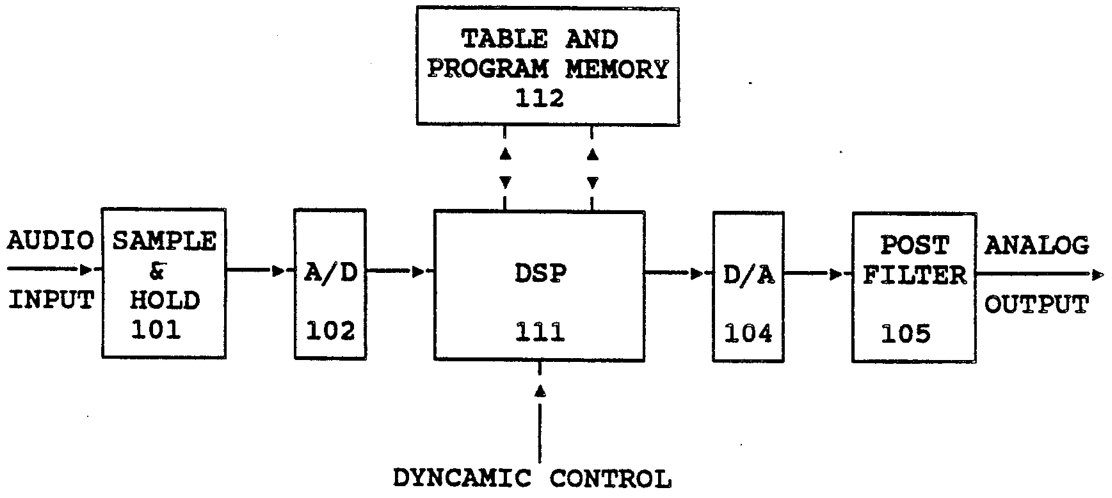
FIG. 5 is a block diagram of an alternative embodiment showing a DSP chip replacing the dedicated RAM array.
Figure 6:
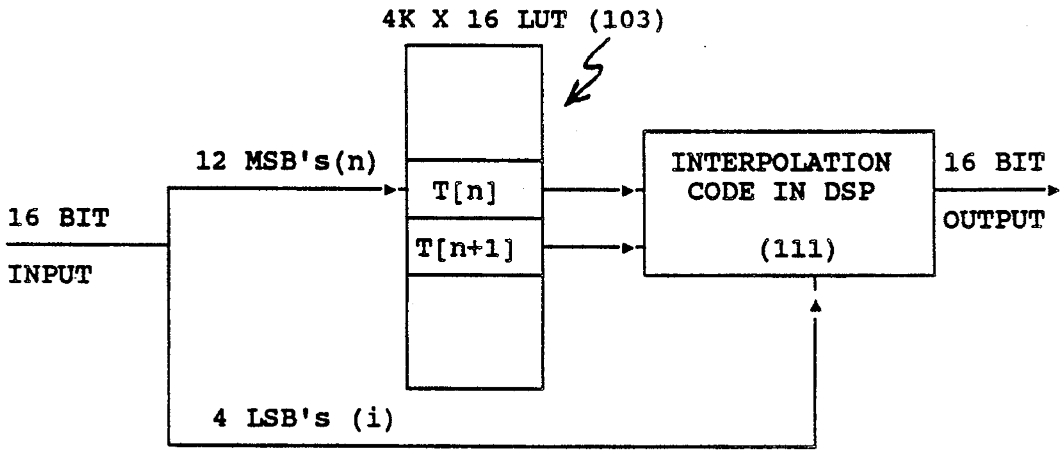
FIG. 6 shows the use of interpolation to improve the overall quality of the audio output.

FIG. 5 shows an alternative to the hardware based schemes outlined above which involves replacing the static RAM array with a general purpose Digital Signal Processor chip such as the Texas Instruments TMS320C25. In this scheme, the DSP 111 executes a simple program which causes it to read in successive values from the A/D convertor every time a new sample is available, via a hardware interrupt. The value read is used as an index into a lookup table stored somewhere in the processor's program memory 112. The value read from the indexed location is then sent to a D/A convertor which can be mapped into the processor's memory space. The post-filtering scheme described above can be used to smooth the output before it is sent to a sound system.

This method has the advantage of increased flexibility, at the cost of having to provide a complete DSP system, including dedicated program memory and related interfaces. Modifications to the basic table lookup operation are achieved by making simple changes to the DSP program. This enables various interpolation and scaling schemes to be implemented without the need for any hardware modifications. Of course, modifications to the table itself are also facilitated with this approach since table editing software can be run directly on the DSP. The DSP can also handle any incoming dynamic control information that may be used to shift the portions of the lookup table being addressed.

Interpolation

Of particular interest is the ability to interpolate to improve the overall audio quality of the system. Through interpolation, it is possible to use a 16-bit A/D convertor without having to increase the size of the LUT memory. This algorithm is illustrated schematically in FIG. 6. Here, the 16 bits from the A/D convertor are split into 2 parts, with the 12 most significant bits forming an address (n) to the 4096-entry table 103, and the 4 least significant bits being used in the interpolation. The value is read from the addressed location as before. The location following the one addressed is also used. The 4 LSBs are interpreted as a fractional part and used to interpolate between these two values according to the following formula:

$$\text{Output Value} = T[n] + \frac{i * (T[n+1] - T[n])}{16}$$

where n is the address formed from the 12 MSBs of the 16-bit input, T[n] is the table value at that address, T[n+1] is the value stored in the next address, and i is the 4-bit number formed by the LSBs.

For example, if the hex value of the A/D output was FC04, the value stored in LUT location FC0 was 455 (decimal), and the value stored in LUT location FC1 was 495 (decimal), the output would be computed as:

$$455 + \frac{4 * (495 - 455)}{16} = 465.$$

The number 465 would then be sent as the interpolated output to the D/A convertor. The DSP code to implement this interpolation is straightforward and can be implemented in the DSP chip 111. This same technique could also be realized in hardware, but would be quite expensive to implement.

In the sections that follow, the Table Lookup operation is taken to be independent of the implementation. Either a DSP-based or dedicated hardware implementation may be used interchangeably.

Prescaling

Due to the inherently non-linear characteristics of the transformations employed, some form of prescaling of the input waveform may be desired in order to control what portions of the table are accessed throughout the evolution of the incoming signal. There are several methods of incorporating prescaling ranging from a simple linear transformation, to more complex nonlinear prescaling functions.

Figure 7A:
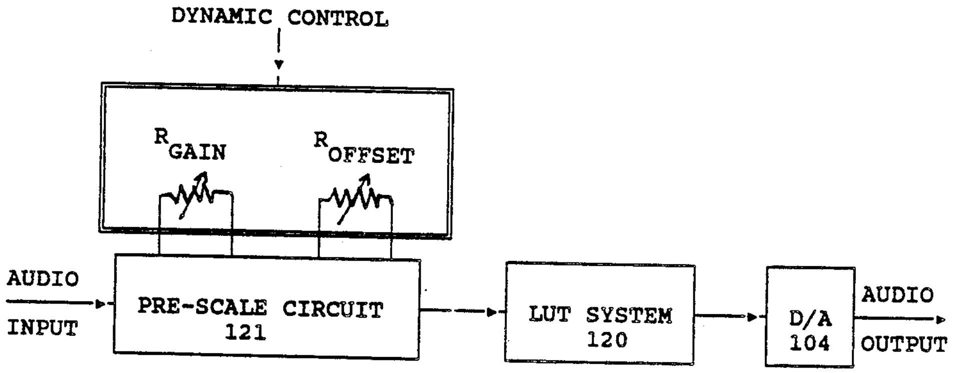
FIGS. 7*a* and *b* illustrate the use of amplitude prescaling.
Figure 7B:
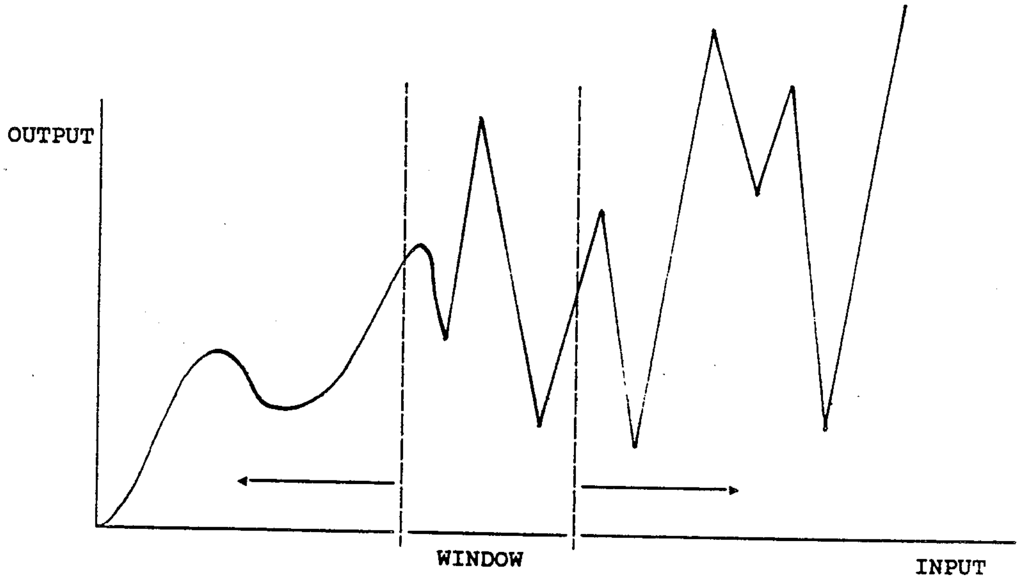

The simplest form of prescaling, illustrated in FIG. 7*a*, involves the addition of a linear prescaling circuit 121 prior to the A/D convertor. Using a pair of potentiometers $R_{gain}$ and $R_{offset}$ in an op-amp circuit, one can control both the gain and the offset of the incoming audio signal. At its simplest, the user can prevent clipping distortion by reducing the input gain. However, through careful adjustment of these two parameters, a variety of timbral transformations can be achieved using only one set of table values. For example, the gain can be reduced so that only a portion of the table is accessed by the input waveform. Then, the actual portion that is accessed can be changed continuously by adjusting the offset potentiometer. This can be viewed as a 'windowing' operation on the table, where a window of accessed table locations slides through the total range of values, as shown in FIG. 7*b*. In one application of this technique, the lower ranges are programmed to have a linear response, while higher regions produce more and more dramatic timbral changes. With this type of table, the offset potentiometer can be viewed as a distortion control. In this architecture, $R_{gain}$ and $R_{offset}$ can be dynamically controlled variables. Clearly, other schemes and tables can be used to achieve a variety of control paradigms without departing from the scope of the invention.

Multiplication of the Output by a Carrier

Figure 8:
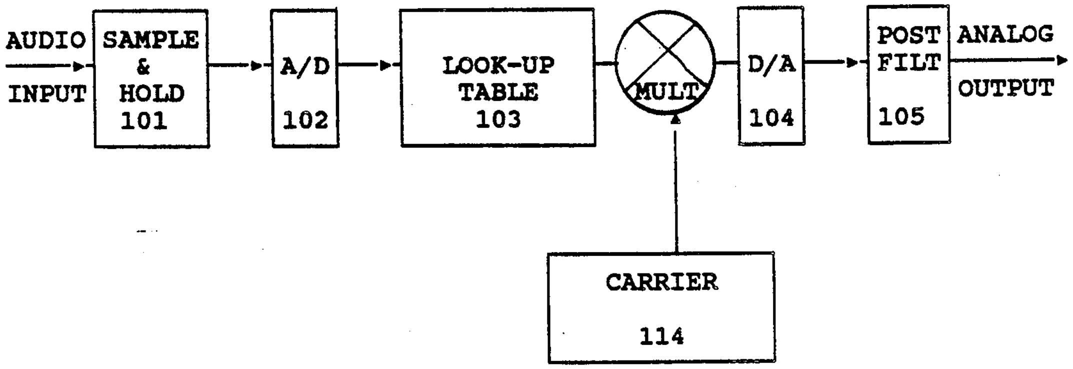
FIG. 8 illustrates the addition of a carrier multiplication to the output of the system.
Figure 9A:
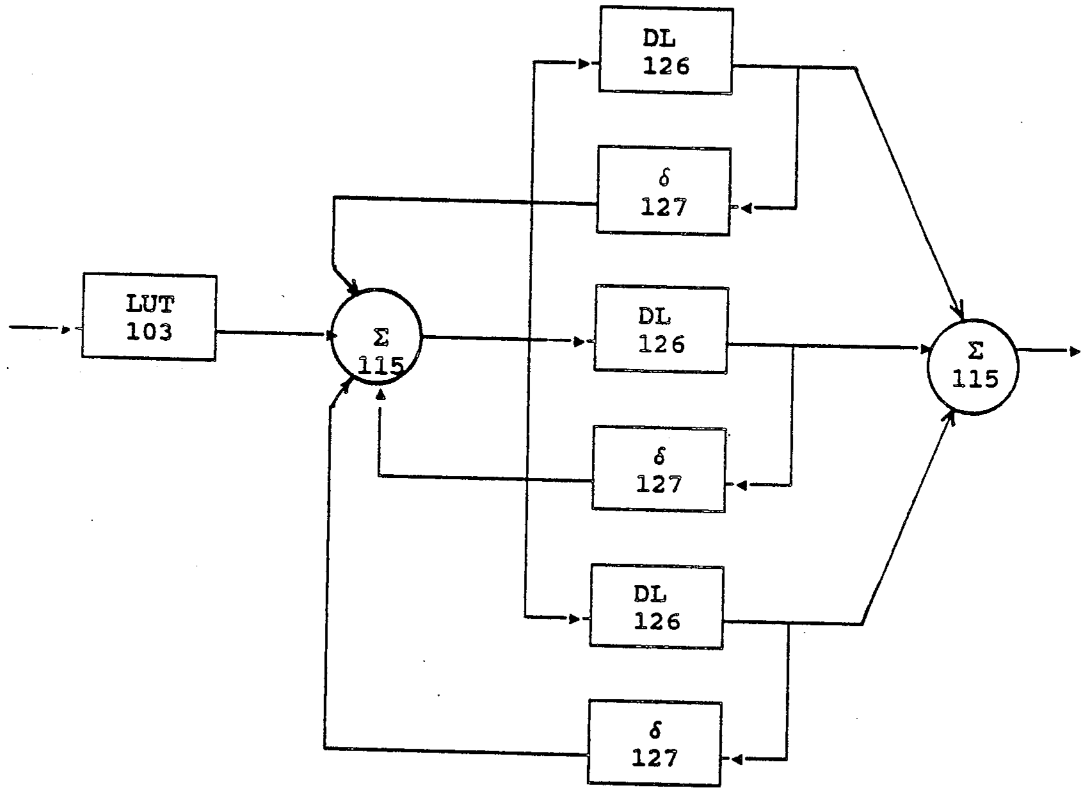
FIGS. 9*a*–*h* show how the invention may be integrated into standard digital delay/reverberation/effects system.
Figure 9B:
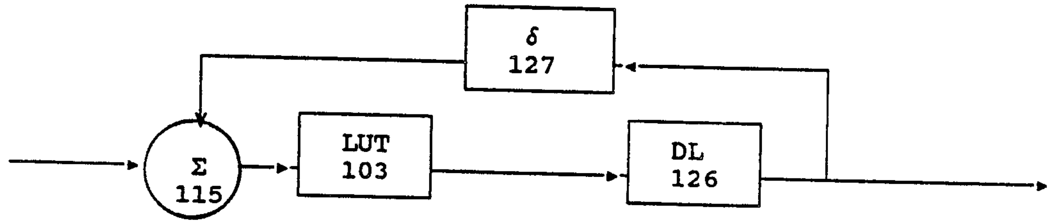
Figure 9C:
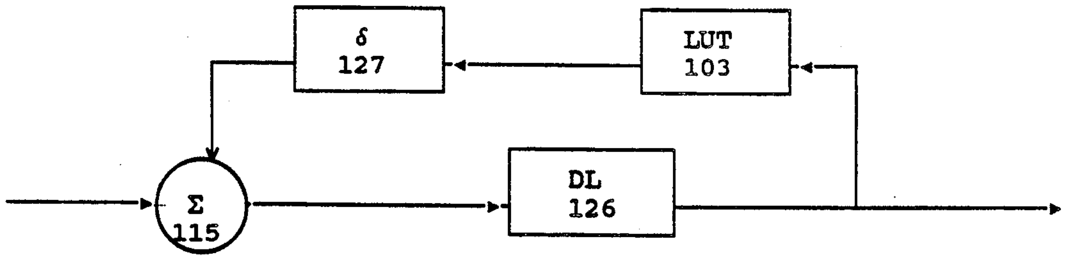
Figure 9D:
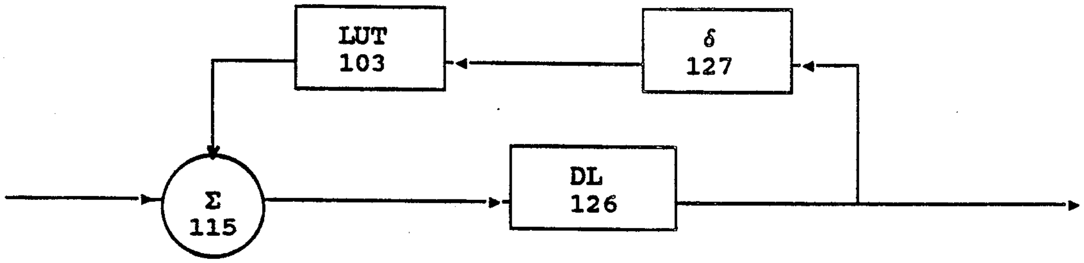
Figure 9E:
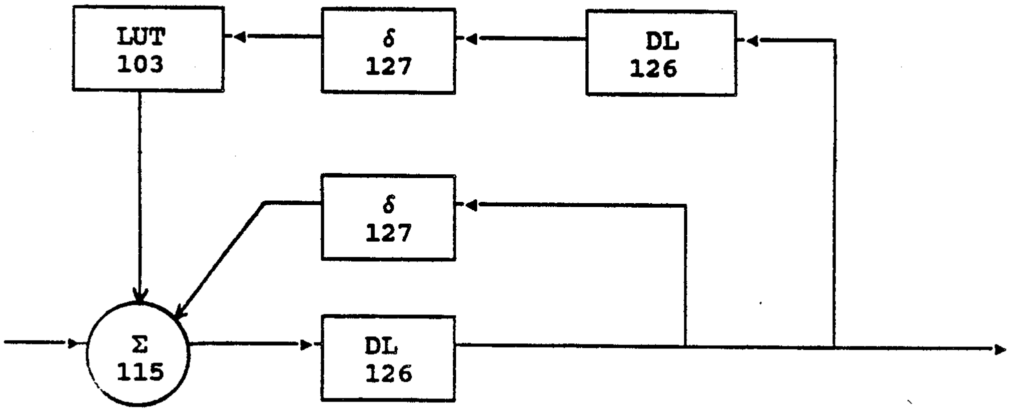
Figure 9F:
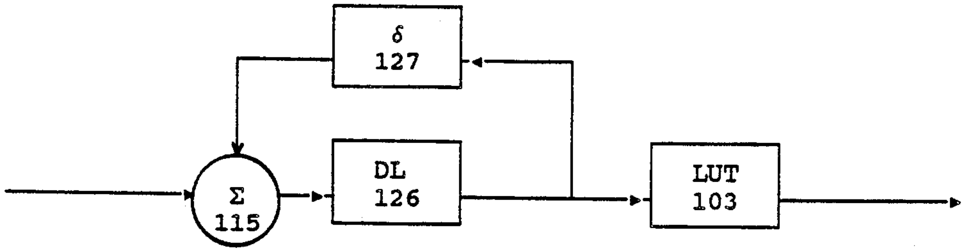
Figure 9G:
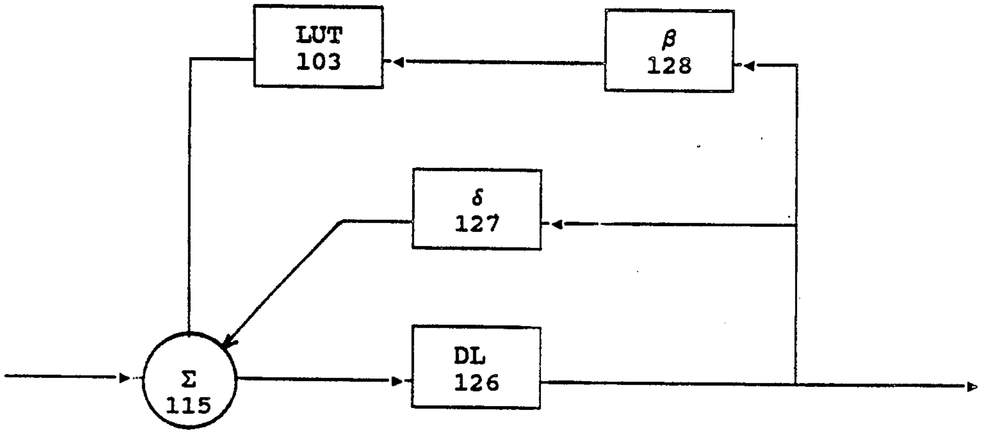
Figure 9H:
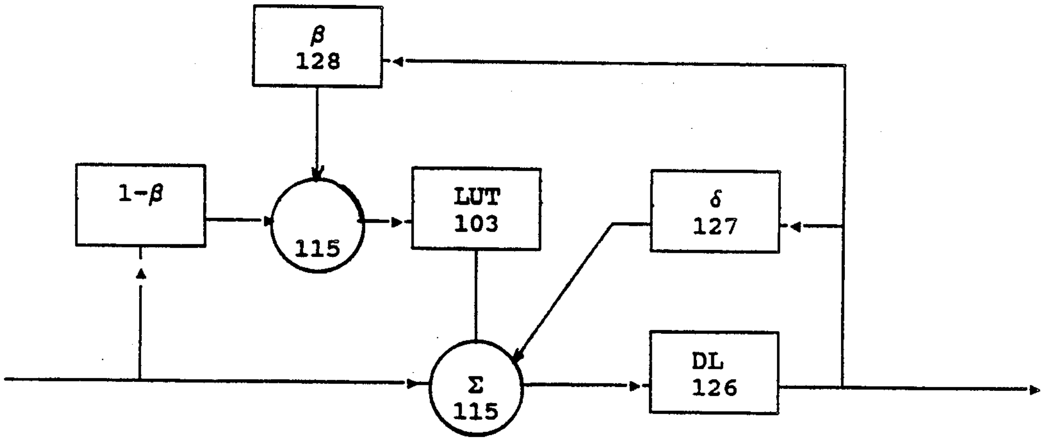

FIG. 8 shows the multiplication of the output by a carrier 114 giving the result of timbral variation of the input signal dependent upon both its input amplitude and its frequency components. The additional partials resulting from this modulation at the output stage will change with the relative amplitudes of the modulator and the carrier, (modulation index) and the frequencies of the modulator and the carrier (ratio). Since the frequency components of the modulator are dependent upon the LUT employed as well as its input amplitude, a highly complex result is obtained.

Incorporation into Reverberation Architectures

Since the more expensive elements of the waveshaping system (i.e. D/A and A/D convertors) are already present in digital reverb systems, the added spectral modifications afforded by waveshaping can be included at a minimal increase in manufacturing cost. The incremental cost is essentially that of the lookup table RAM itself. ROM can be used in place of RAM where it is not necessary to allow table modification.

FIGS. *9a–h* illustrate how the invention can be incorporated into a digital reverberation system. The signal from the A/D convertor passes through one or more digital delay line elements (DL) 126 of varying delay times. The delayed signals are summed before being output. Also, varying amounts (as specified by the different gain control blocks δ127 of the delayed signals are fed back and added to current input signal. This process sets up the delay loop which causes the reverberant effect. Note that these are highly simplified diagrams of some typical reverb architectures, and detailed implementations are readily found in prior art. Additionally, it is understood that any of the delay elements 126 or gain control blocks 127 may be dynamically controlled.

In FIG. *9a*, each of these delay elements DL is represented individually. It is understood that multiple elements may also be implied in FIGS. *9b–h*. In such cases, multiple LUT elements may be required, depending on the specific arrangement. The multiple LUTs can be comprised of separate physical LUTs, or alternatively, one LUT being shared among the different paths, using a time-multiplexed technique.

Different placements of the LUT with respect to the reverb elements result in significant differences in the way the incoming signal is processed. If, for example, the LUT is placed before the reverb unit, as in FIG. *9a*, the nonlinearly processed signal with all of the added spectral content enters the reverberation loop. This could lead to a very complex and/or bright overall reverberation effect, possibly introducing unwanted instabilities and oscillations. On the other hand, if the LUT is placed immediately after the reverb unit, as in FIG. *9e*, the result would be a global (and variable) brightening of the reverb unit's audio output.

More interesting results are obtained when the LUT is placed somewhere within the architecture of the reverb unit itself as shown in FIGS. *9b, c,* and *d*. In these cases, the feedback inherent in reverb systems adds considerable complexity to the effect of the waveshaper itself. Each pass through the reverb loop (or each echo, for long delay times) is subject to the nonlinear processing, with more and more high spectral components being added in each time. This can lead to some very unique results wherein a sound actually gets brighter and more complex as it fades away over the course of the reverberation.

FIG. *9e* shows a scheme which has a separate feedback path for the LUT-processed signal. Both the non-processed and processed signals have independent gain elements 127, affording control over the amount of added harmonic that is added into the delay loop. Furthermore, a separate delay element 126 can be used for the processed signal feedback path. This allows the harmonics produced by the non-linear transformation to be delayed prior to being added to the input signal, creating different sonic effects based on the relative delay. Very short delays of the processed signal, on the order of a 90 degree phase shift of the input signal, may be effectively added to the unprocessed input for certain useful effects.

Clearly, some very complex interactions are set up between the LUT(s) and various parameters of the reverberation, such as the delay gain elements 127. With multiple LUT configurations, varying amounts of spectral modification operate on each of the delayed components as the individual delay gain elements 127 are adjusted.

Multiple lookup Tables with Crossfade Circuitry

Figure 10:
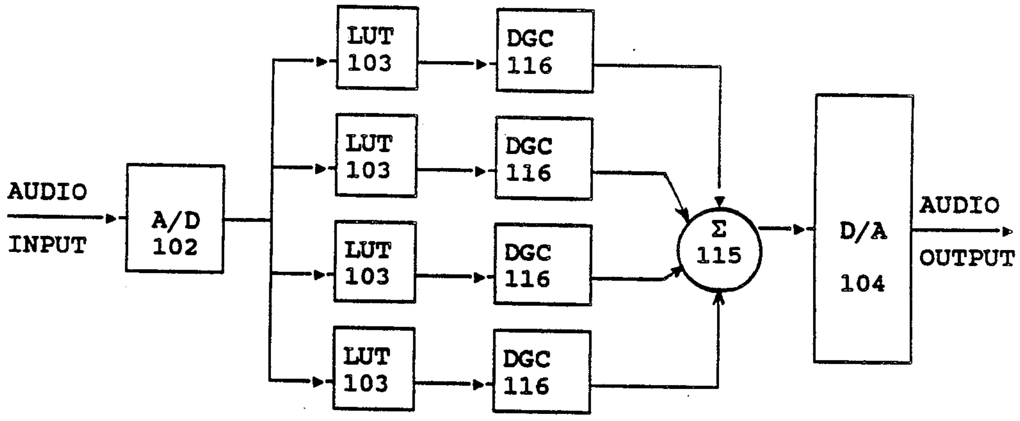
FIG. 10 shows the invention in a multiple lookup table system with the capability of crossfading between tables.

FIG. 10 shows the use of a number of look-up tables in parallel along with the capability to crossfade between selected outputs. The arbitrary audio is input to the A/D converter 102 and sent from there to several LUT's 103 in parallel. The output of each LUT is routed to an independent DGC (Digital Gain Control) device 116. The summed output is fed to the D/A converter 104. This configuration enables the blending of independently processed outputs for obtaining otherwise inaccessible timbres and continual timbral transitions not possible with a one LUT system. Additionally, a double buffering scheme could be devised in which one table is reloaded while not in use and is subsequently used while other tables are reloaded. In this way, the uninterrupted timbral transformations could continue indefinitely.

Real-Time FFT with Multiple Tables

Figure 11:
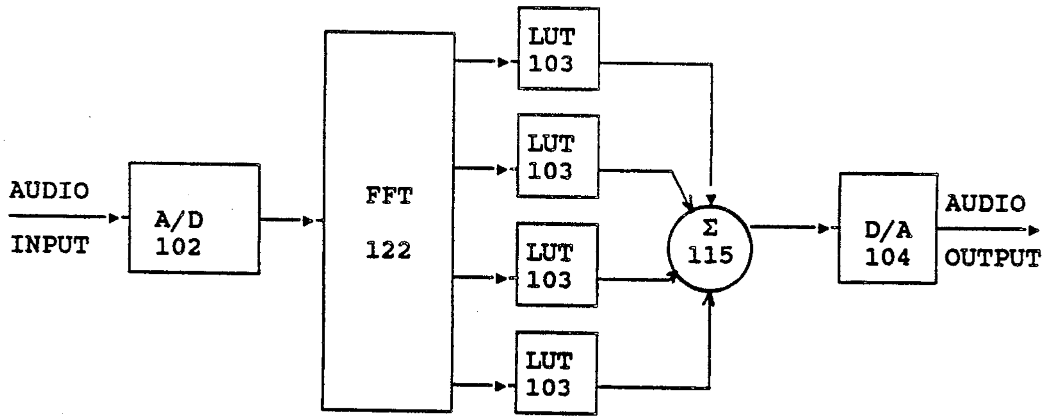
FIG. 11 shows the invention integrated into a Fast Fourier Transform (FFT) system with individual tables on each FFT output.

In FIG. 11 the complex audio input digitized and analyzed into its component sine waves by the Fast Fourier Transform technique 122. The output is mixed in an adder Σ115. The resultant independent sine waves are output to various LUT's for further processing. This technique overcomes one of the problems inherent in the LUT technique wherein if the audio input contains multiple component frequencies, all of those frequencies are subject to the same LUT curve. The mixing that results is often undesirable musically, especially when non-harmonic partials are prominent in the input signal.

Post Scaling to Restore RMS Level

Figure 12:
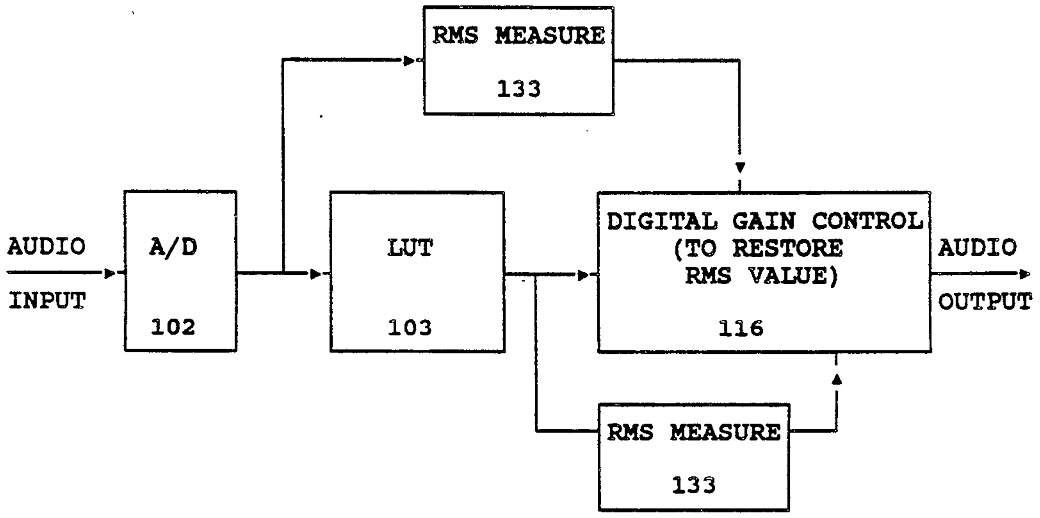
FIG. 12 shows the use of a digital gain control circuit to restore the RMS level of the input.

The process of non-linear transformation can have a large effect on the RMS level of the transformed signal. This may be undesirable, since there is no longer a simple relationship between the amplitude of the input and the perceived loudness of the output. FIG. 12 shows a circuit that can be used to keep the RMS level of the output signal constant after processing. The input signal is fed both to the LUT 103 and to an RMS measurement circuit 133. The RMS level of the output of the LUT is also measured. The two RMS levels are compared by the digital gain control circuit 116 and the gain is adjusted so that the RMS level of the final output signal will be the same as that of the input.

If, for example, the LUT acted to boost the RMS level of the input signal by 6 dB, the digital gain control circuit would attenuate the signal by a corresponding 6 dB.

Pre- and Post-Filtering

It may be desireable to employ some filtering operations in order to provide an additional level of control over the harmonic content added by the non-linear transformation. For example, in FIG. 13*a*, a filter 132 is placed in front of the LUT, so that only some subset of the spectral content of the input signal will actually be processed, with the remainder of the signal bypassing the table. This would allow, for example, only the high-frequency components of the input to be enhanced or otherwise processed by the table, while low frequencies would remain unmodified. Clearly, other filter types (e.g. low- or band-pass) may be substituted here. A dynamic control input is also shown, allowing the cut-off or other filter parameters to be modified in real time.

Figure 13A:
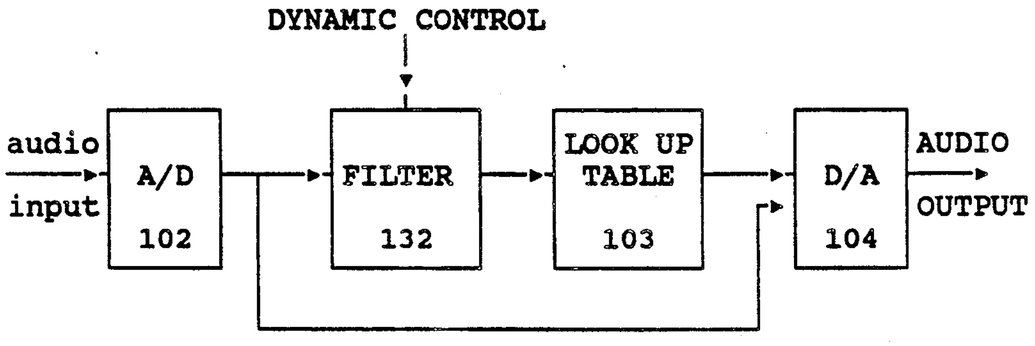
FIGS. 13*a* and 13*b* show the use of a filter before and after the lookup table.
Figure 13B:
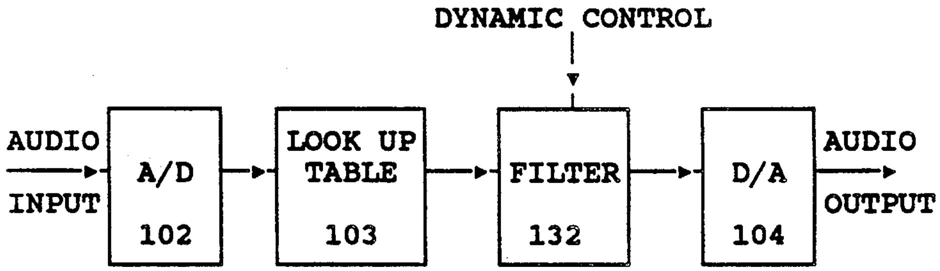

Another filter scheme is illustrated in FIG. 13*b*, where the filter comes after the LUT operation. In this case, the harmonic information added by the non-linear processing may be further controlled before being output. For example, a table may be defined which adds a great deal of high-frequency content, some of which may be undesirable, to the signal's spectrum. By using a filter 132 after the LUT, some of this added high-frequency information can be removed. Again, various other filter types may be employed, and the filter parameters may be affected by some dynamic control information during use.

Feedback with Gain Control

Figure 14:
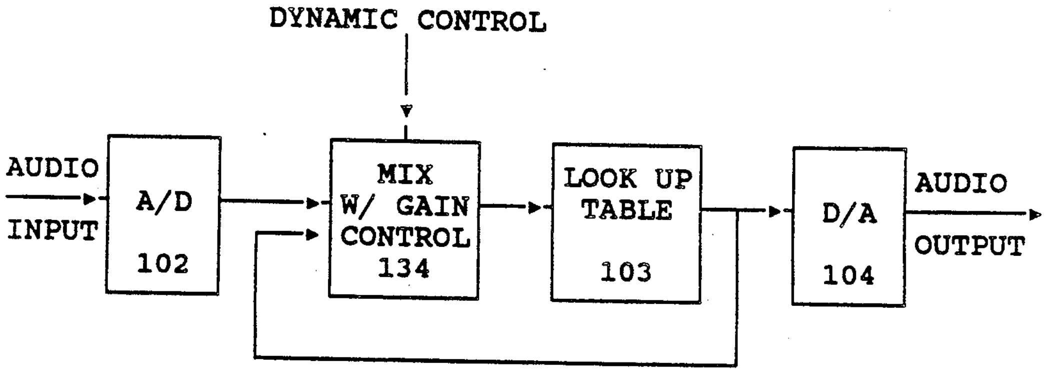
FIG. 14 illustrates the addition of feedback with gain control.

By incorporating feedback into the system, a number of complex effects can be realized. Some amount of the processed signal is fed back to the input, as shown in FIG. 14. The amount fed back is controlled by the mix and gain control block 134, which in turn may be affected by a dynamic control input. The stability of the feedback loop is greatly affected by the function programmed into the LUT. Some classes of tables will be inherently stable (e.g. those for which the values at the extreme ends approach 0), while others will produce much less predictable results including oscillation or saturation.

Figure 15:
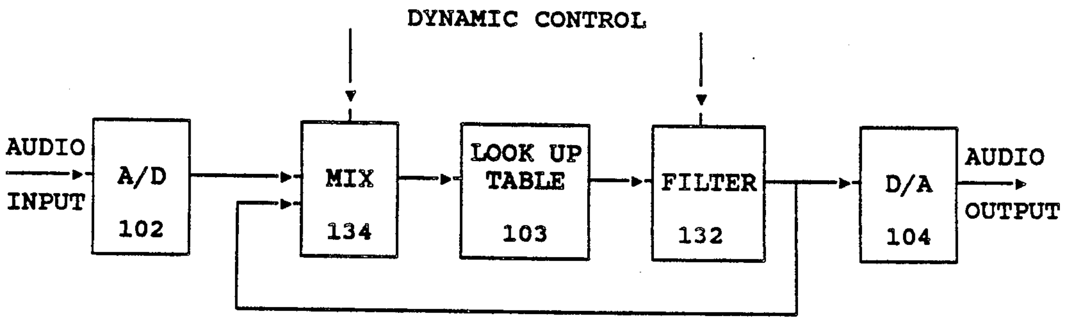
FIG. 15 shows the use of feedback and filtering with the lookup table.

By combining the operations of filter and feedback, as shown in FIG. 15, more control is provided over the response of the system. Here, the output of the look-up table is passed through a filter 132 before being fed back to the input. If, for example, an undesirable oscillation were set up due to the feedback, the filter could be set up to reduce or eliminate that frequency from the loop. Again, there is the possibility to control the filter parameters in real time to facilitate such adjustments.

It should be noted that there are many possible combinations of filtering and feedback not explicitly illustrated, such as placing the filter before or after the LUT, but that such permutations can be readily constructed by anyone skilled in the art without departing from the spirit of the invention.

Input Signals From Digital Signal Memory

Digital signal memory, in the context of what will be discussed, refers to a memory into which a segment of arbitrary audio, known colloquially as a sample, is stored. Such a memory can be found in a typical sampling architecture such as in FIG. 16.

As this figure shows, the invention can easily be incorporated into this architecture. In such a system, the LUT address is no longer limited to the output of an A/D convertor 102, but can include the output of a digital signal memory 130 or any other digital audio source 138. This selection may be made under control of a switch S1, where more than one such source is provided.

Figure 16:
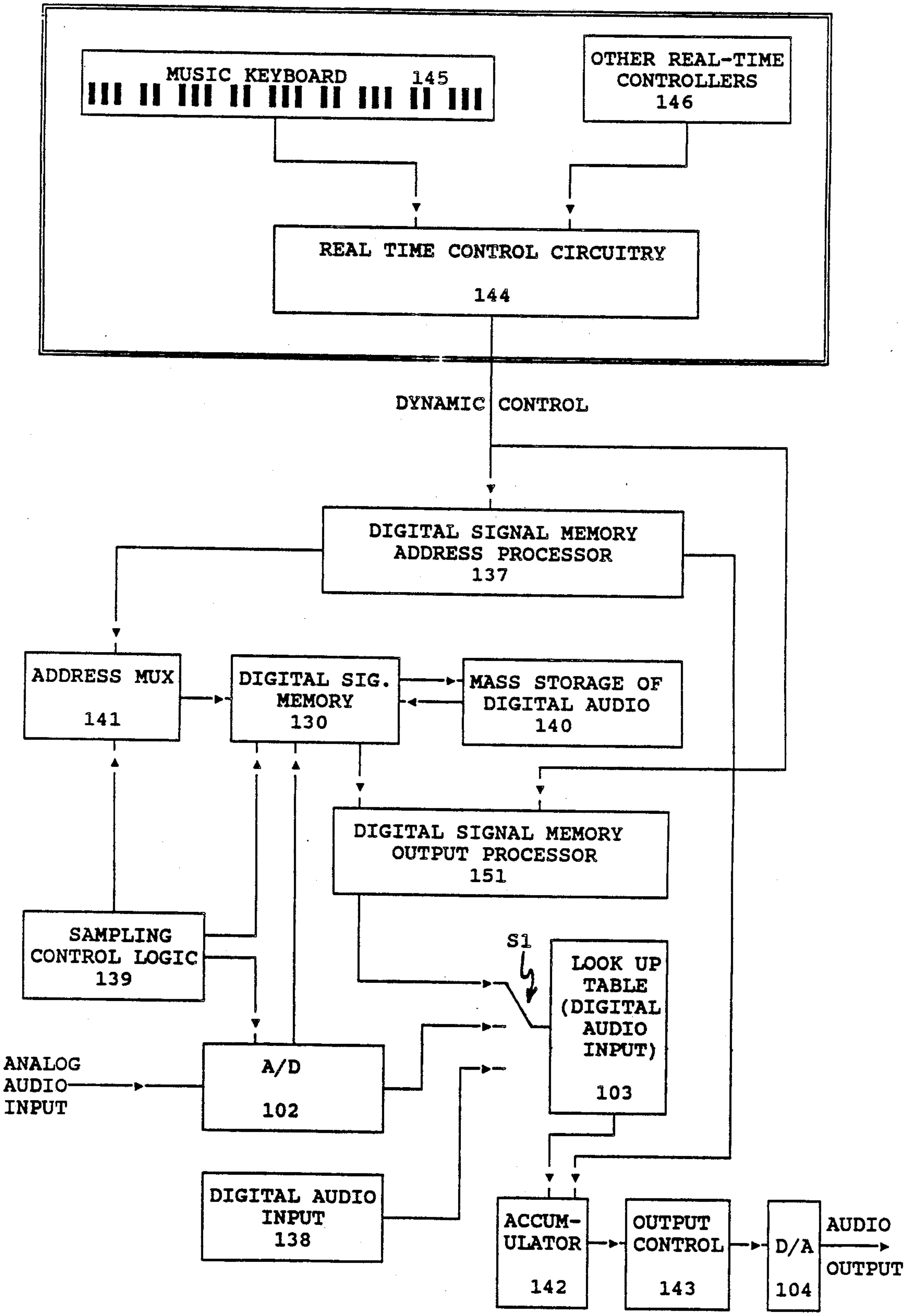
FIG. 16 is a block diagram showing the incorporation of the lookup table into a system that includes analog audio input, digital signal memory, digital audio inputs, and various control mechanisms.

The sampling system shown in FIG. 16 typically includes a music keyboard 145 for entering notes to be played. The keyboard and other dynamic real-time controllers 146 are scanned by the real-time control circuitry 144. In addition to providing information about the notes played, these controllers provide other real-time control information, including data that represents such variables as key velocity, key pressure, potentiometer values, etc. This dynamic control information is used by both the digital signal memory address processor block 137 and the digital signal memory output processor 151 to affect various sonic parameters such as amplitude and vibrato.

While the keyboard is being played, each note that is currently active (depressed) on the keyboard 145 will cause a sequence of addresses to be generated by the digital signal memory address processor block 137. These addresses will be selected to address the sample memory 130 by the address multiplexor 141. The sequence of addresses generated will cause the signal stored in the sample memory 130 to be read out at a frequency corresponding to that note. The lowest possible frequency (typically corresponding to the lowest note on the keyboard) will be generated when every location in the memory is read out sequentially. Higher frequencies are obtained by interpolation methods such as those described in Snell *Design of a Digital Oscillator that will generate up to 256 Low-Distortion Sine Waves in Real Time*, pp. 289–334, ("Foundations of Computer Music", Curtis Roads and John Strawn, ed. MIT Press, Cambridge, Mass., 1987.) It is also possible, by similar interpolation methods, to produce frequencies lower than those achieved when every location is read.

At its simplest, these frequencies can be obtained by skipping samples appropriately (0 order interpolation). Another way to vary the pitch is to read all of the samples in the memory, but to vary the rate they are read as a function of the note played. This latter method, also known as variable sample rate, disallows the use of a time multiplexing technique to use one LUT for processing multiple active notes.

In addition to controlling note pitch, other frequency domain parameters, such as vibrato and phase or frequency modulation, can be controlled through manipulation of the addresses applied to the digital signal memory 130. These frequency domain parameters can all be affected by the dynamic control information.

Typically the addresses can be generated and the sample memory accessed much more quickly than the output sample rate of the system. This fact allows the use of time multiplexing of the addresses to the sample memory from the set of all currently active notes. The address processing logic maintains a list of pointers into the memory, with one pointer being used for each active note. These pointers each get incremented by a fixed phase increment once during each sample rate period by an amount proportional to the frequency of the note played. For example, if 2 notes are active, one an octave higher than the other, then during each output sample interval, the sample playback circuit will: (1) add a first fixed phase increment to the pointer register corresponding to the first note, (2) add a second fixed phase increment, twice as large as the first, to the pointer register corresponding to the second note, (3) supply the newly updated first pointer as an address to the sample table and (4) supply the newly updated second pointer as an address to the sample table. The order of these events may be different, provided that the pointers get updated prior to being used to address the table. The number of pointers to be updated is equal to the number of currently active notes, up to the maximum allowed by the system, which is usually determined by the speed of the hardware relative to the sample rate. The sequence of addresses to the digital signal memory is hence time-multiplexed, with one time-slot for each active note. A more detailed description of time-multiplexing techniques as applied to digital audio waveform generation can be found in Snell, above. The detailed construction of a sampling instrument is not described, as this can be found in prior art. As examples, see the operator's manual or service literature for the Emulator III (EIII) digital sound production system from E-Mu Systems, Scotts Valley, Calif.

The addresses that are successively applied to the digital signal memory 130 will cause a corresponding sequence of data values to be read out, again in time-multiplex fashion. The data so addressed is processed by the digital signal memory output processor 151 in response to dynamic control data. This control data affects amplitude and other time-domain parameters such as tremolo, amplitude modulation, dynamic envelope control, and waveform mixing. These can then be selected by switch S1 to address the non-linear transformation LUT 103. The time-multiplexed, transformed data from the LUT are then recombined by the accumulator 142 which successively adds up all of the samples that arrive during one output sample interval. This sum represents the instantaneous value of a signal which is the sum of multiple signals, each independently processed by the LUT and each corresponding to a different note played on the keyboard. This result is then transferred to the output control logic 143, which conditions the data (e.g. digital filtering, gain control, reverb, etc.), producing the final output sample which is sent to the D/A convertor 104.

A second mode is enabled when switch S1 is set to select the output of the A/D convertor 102. In this case, the real-time signal processing system that has been described above will result, with real-time audio input being transformed via the LUT as it occurs. The accumulator 142 will be disabled in this mode, simply transferring data from the LUT directly to the output control logic 143.

The A/D audio input is also used to create tables for storage into the sample memory 130. Here, the address multiplexor MUX 141 will select addresses generated by the sampling control logic 139 to address the digital signal memory 130. The data will be written from the output of the A/D into successive locations in the sample memory, under control of the sampling control logic. When the sampling operation is complete, a digital copy of some part of the original analog input will be in the sample memory. The amount of the original signal that is stored depends upon how much sample memory there is, and on how high the sampling rate is. For example, with a 50 kHz sampling rate with 1 Million sample locations in the memory, there will be enough room to store 20 seconds of arbitrary audio. If it is necessary to store the information in the sample memory for later use, a digital audio mass storage device 140, such as a hard disk or floppy disk, may be included. Samples can then be transferred back and forth between the sample memory and the mass storage as required.

A third mode of operation is enabled when switch S1 is set to select the digital audio input 138. Such input may come from any device capable of producing digital audio output, such as a CD player so equipped, a digital mixing board, or an external computer or synthesizer, provided a protocol for transferring digital audio exists. These digital audio signals are processed in real time as in the second mode described above and earlier in this document, with the only difference being that the A/D converter is bypassed. Again, the accumulator 142 will be disabled, passing the transformed digital audio directly to the output section.

Dedicated LUT-based Sampling Implementation

Figure 17A:
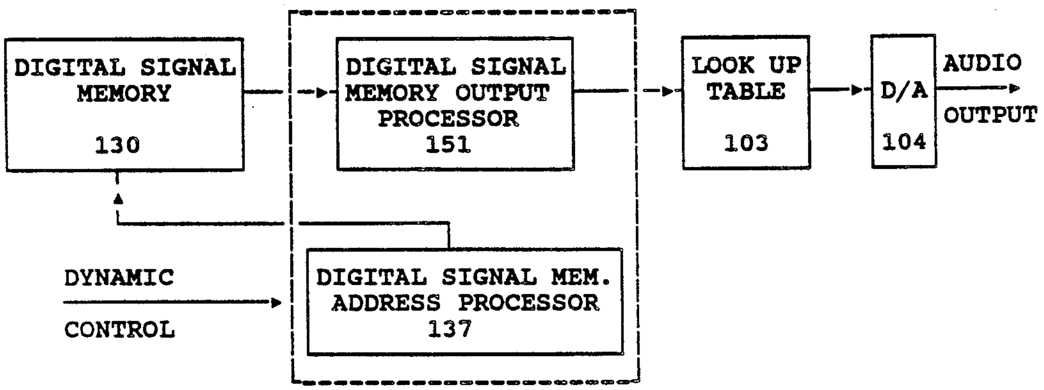
FIGS. 17*a* and 17*b* show simplified versions of two possible schemes for incorporating the lookup table operation into a digital signal memory playback system (e.g. sampler).

FIG. 17a shows a simplified version of the sampling architecture detailed in FIG. 16. It shows the use of a separate dedicated memory for the output nonlinear processing.

A system that utilized custom VLSI circuits to implement memory address and data processing functions could be easily modified to include the LUT operation using this approach. Dynamic control information is again used by both the digital signal memory address processor block 137 and the digital signal memory output processor 151 to affect various parameters of the data applied to the LUT 103. Essentially, the digital audio inputs to the D/A convertor could be applied to the LUT first, regardless of the structure of the rest of the system. It may be desireable to access the digital audio information from each active note before it is summed via the accumulator (142 in FIG. 16), in order to avoid the mixing that occurs when multiple notes are non-linearly processed.

Incorporating LUT Processing into DSP-based Sampling Implementations

Figure 17B:
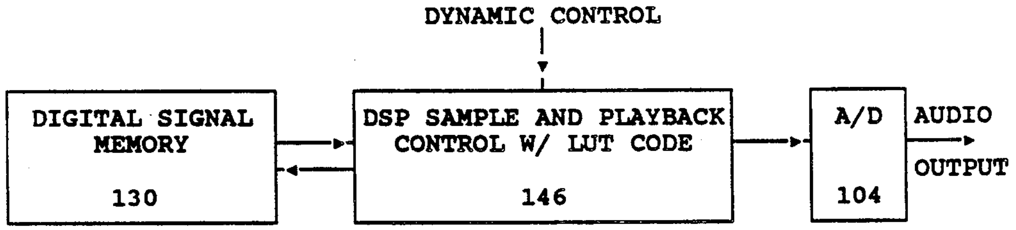

FIG. 17b shows a simplified diagram of a sampling system where the sample playback, processing, and control functions are performed by a programmable digital signal processor. In this case, adding the LUT function is strictly a matter of adding the table lookup algorithm to the sample output routine of the DSP, and allocating enough DSP memory to store one or more non-linear transformation tables. The DSP in this case will generate the multiplexed addresses and read the resulting samples from the digital signal memory 130. The DSP will also control various real-time parameters in response to dynamic control information. These modified digital signal memory values are then transformed by a DSP LUT operation (with an optional interpolation step for systems using sample data that is wider than the lookup table address). The result of the (interpolated) lookup is then accumulated, output processing is performed, and the sample is sent to the D/A convertor.

At this point, it should be noted that all of the various processing schemes described above in reference to the stand-alone signal processor implementations (carrier multiplication, reverberation/delay, multiple tables with cross-fade, Real-time FFT, post-scaling to restore RMS level, filtering, and feedback) can be applied just as readily within the context of a sampling system. Since the ultimate input to the table is digital audio information, and sampling systems operate on digital audio information stored in a memory, no generality is lost by having introduced those concepts in the context of stand-alone signal processing. Note that the pre-scaling technique is not included here, since it implied some processing of the signal while it was still in the analog form, which is not assumed to be accessible in the sampling system.

Furthermore, these concepts can all be realized by adding modules to the code being executed by the DSP in DSP-based sampling systems, provided that the DSP has enough processing power to handle the additional computations involved. While it is realized that there may be some practical limitation on how much can be achieved using current DSP technology, it is clear that more and more functions can be performed as the technology improves, and that these improvements will have been anticipated by this invention.

It is also possible to implement these techniques using dedicated hardware for each element. Depending on the technique, this may or may not be an efficient way to implement it. For example, dedicated hardware for filtering may be quite sophisticated, while the hardware required for cross-fading between tables may be more modest.

Note-dependent Table Selection

Figure 18A:
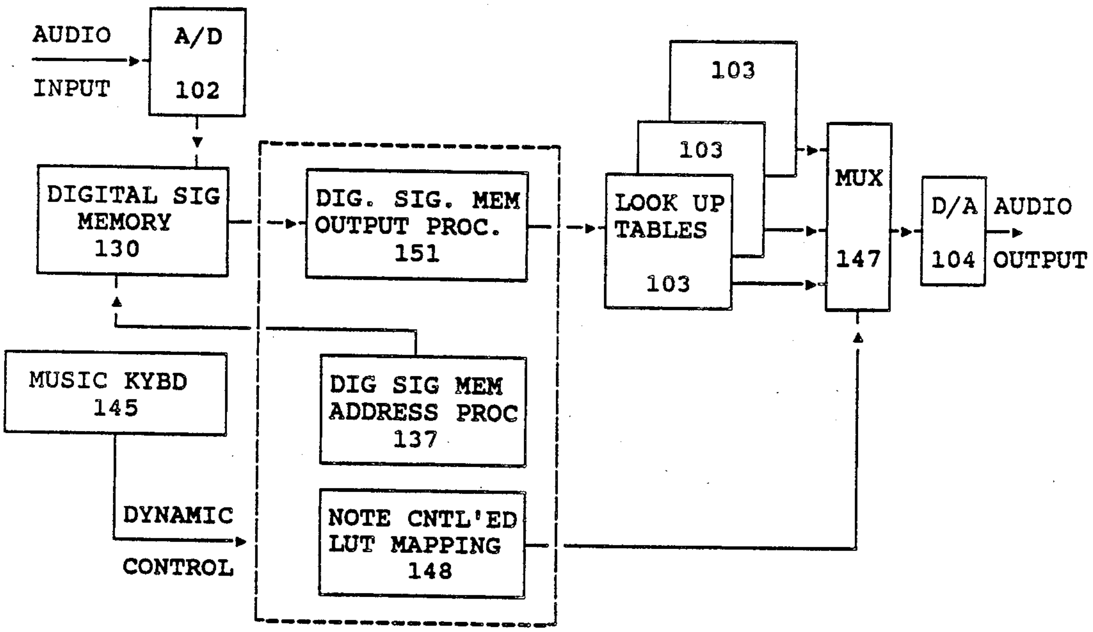
FIGS. 18*a* and 18*b* show two different schemes for causing the non-linear transformation applied to depend on the note being played on the keyboard, while 18*c* shows a sample LUT for combining multiple tables into one larger table for use with the schemes described in FIGS. 18*a* and 18*b*.

FIG. 18*a* illustrates a digital variation of the analog prescaling technique illustrated in FIGS. *7a* and *7b*. Here, multiple lookup tables are simultaneously applied to the samples read out of the digital signal memory 130. The various transformed samples are input to a multiplexor 147, which selects one of the transformed versions, based on some function of the note being played. The relationship between the note played on the music keyboard 145 (or other controller) and the table selected is specified in the note-controlled LUT mapping table 148.

Note that a digital mixer can be substituted for the MUX operation 147. In this case, the output is a mix of two or more LUT outputs depending on coefficients stored in the mapping table 148.

Figure 18B:
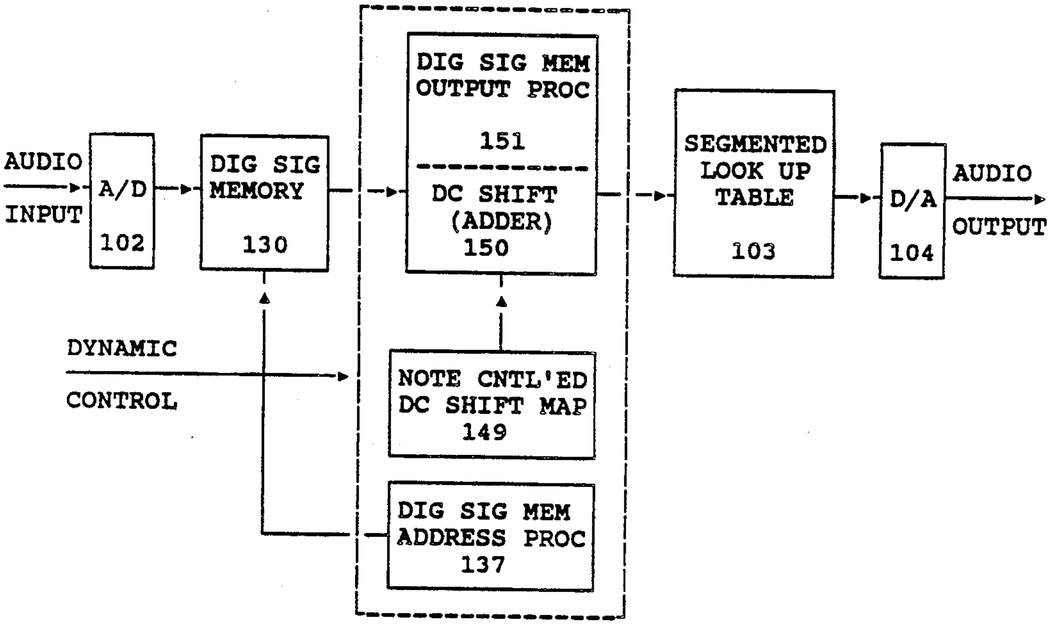
Figure 18C:
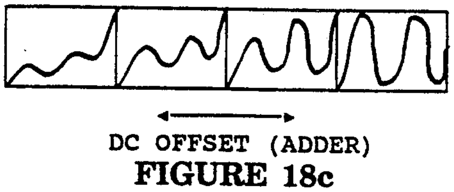

FIG. 18*b* shows another method of implementing note-dependent table selection based on the use of a single compound table such as that illustrated in FIG. 18*c*. Here, a constant (DC) digital value is added to the output of the digital signal memory 130 by a DC shift block 150 prior to the table lookup operation. This DC shift determines which portion of the compound table is accessed and is in turn a function of a note-to-DC shift mapping table 149. The note-controlled DC shift mapping can also be responsive to dynamic control. For example, key pressure could be used to affect the DC offset of the LUT input data. The DC shift mechanism, or adder, may be part of the digital signal memory output processor 151.

Real-time Sample Memory Modification After Transformation

Figure 19:
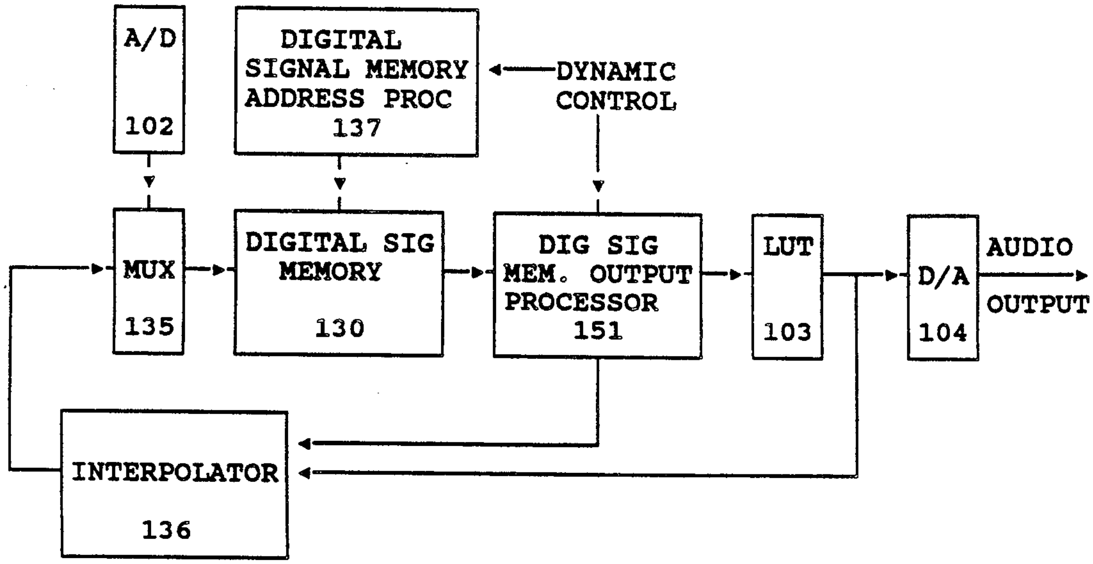
FIG. 19 shows a mechanism whereby the contents of the digital signal memory can be modified over the evolution of a note by feedback of the lookup table output.

FIG. 19 shows a mechanism whereby the contents of the digital signal memory can be modified over the evolution of a note by feedback of the lookup table output. When the waveform is initially sampled, the MUX 135 selects the output of the A/D convertor 102, and the digitized audio is stored into the digital signal memory 130. During sample playback, the MUX 135 selects the output of the interpolator 136. The interpolator takes data from before and after the LUT 103 and produces values that are interpolated between these. This mixture of processed and non-processed sample memory values is then written back into the sample memory. In this fashion, the data in the sample memory gets progressively modified as it makes successive passes through the loop. Ultimately, the data will bear little resemblance to the initially stored waveform, with a spectrum having increasingly large amounts of high frequency components.

Schematic Diagram of Turbosynth, Prior Art by Digidesign

Figure 20:
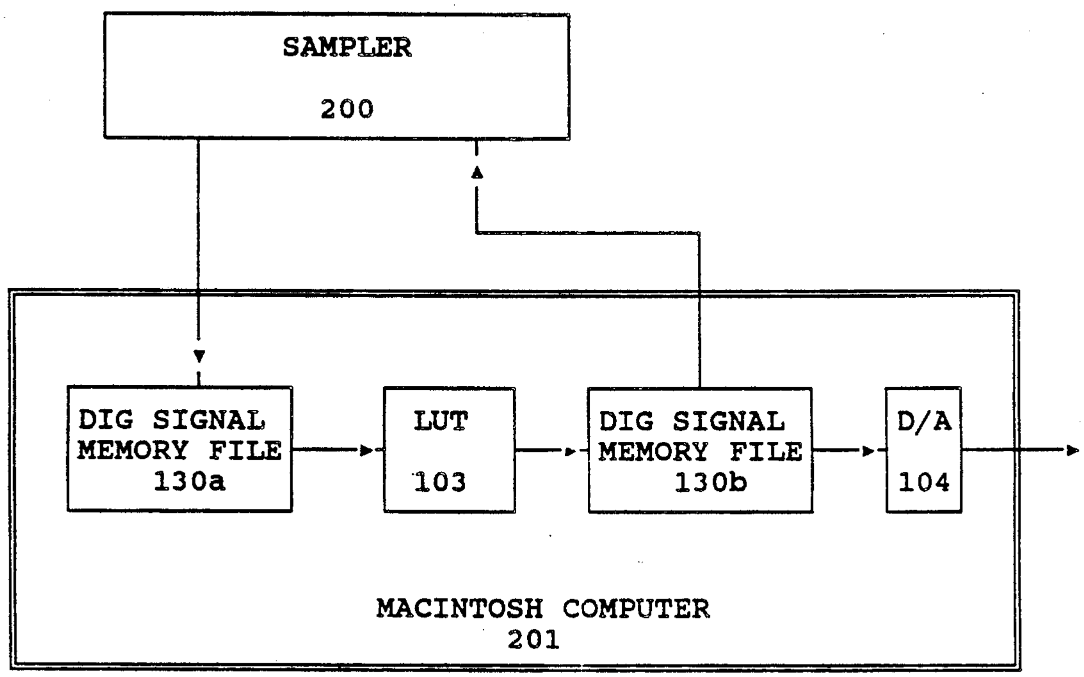
FIG. 20 shows schematically the operation of the Turbosynth program by Digidesign.

Structurally, Turbosynth, as it may relate to the present invention, can be thought of as shown in FIG. 20. In this example, only the waveshaper tool is employed. A digital audio sample from a sampler 200 is transferred to digital signal memory file 130*a* in the Macintosh computer 201. It is then processed via the waveshaper tool, which is a look up table 103. The output of the look up table is a second digital signal memory file 130*b* which may optionally be previewed using the Macintosh D/A converter 104 and speaker 125. If the user wishes to use the sound for performance, it would be transferred back to the sampler 200. The transformed sound is now fixed in the sampler's memory and when the instrument is played, all RMS amplitude changes, filter changes, and so on, are performed upon the new, fixed timbre.

Many modifications of the preferred embodiment will readily occur to those skilled in the art upon consideration of the disclosure. Accordingly, the invention is to be construed as including all structures, systems, devices, circuits or the like that are within the scope of the appended claims.

What is claimed is:

1. A digital audio signal processor comprising:

input means for receiving input digital signals having values representative of the instantaneous amplitudes of arbitrary complex input audio signals;

non-linear transformation means for translating on a real-time basis said input digital signals in accordance with a pre-determined translation map to produce output digital signals having a predetermined amplitude for each specified input digital signal amplitude;

output means for transmitting output digital signals having values representative of the instantaneous amplitudes of arbitrary output audio signals, whereby arbitrary input audio signals are non-linearly modified by said non-linear transformation means and outputted in a form suitable for being reproduced in audible form.

2. A digital audio signal processor as defined in claim 1, further comprising input conversion means for receiving arbitrary complex input audio signals and converting same into said input digital signals.

3. A digital audio signal processor as defined in claim 1, further comprising output conversion means for converting said output digital signals into analog form as an analog audio output signal suitable for being reproduced in audible form.

4. A digital audio signal processor as defined in claim 1, further comprising dynamic control means for controlling on a real-time basis the parameters of the audio signal prior to being input to the non-linear transformation means.

5. A digital audio signal processor as defined in claim 1, wherein said non-linear transformation means comprises a digital signal processor (DSP).

6. A digital audio signal processor as defined in claim 1, wherein said non-linear transformation means comprises a look-up table (LUT).

7. A digital audio signal processor as defined in claim 6, further comprising computer means for generating a translation map in said LUT consisting of at least one of the following mapping elements: sinewave, line segments, splines, arbitrary polynomials, chebyshev polynomials and pseudo-random numbers.

8. A digital audio signal processor as defined in claim 1, further comprising pre-scaling means for establishing portions of said translation map to be accessed by the incoming audio.

9. A digital audio signal processor as defined in claim 1, further comprising modulation means for modulating a digital output from said non-linear transformation means.

10. A digital audio signal processor as defined in claim 1, further comprising reverberation means for reverberating at least one of said input and output digital signals associated with said non-linear transformation means.

11. A digital audio signal processor as defined in claim 3, comprising a plurality of non-linear translation means for processing incoming audio signals in accordance with different translation maps; and combining means for combining the outputs of said plurality of non-linear transformation means prior to processing by said output conversion means.

12. A digital audio signal processor as defined in claim 3, further comprising frequency separation means for separating said incoming audio into its constituent frequencies; and a plurality of non-linear transformation means each arranged to process another one of a plurality of frequencies, and summing means for summing the outputs of said plurality of transformation means prior to processing by said output conversion means.

13. A digital audio signal processor as defined in claim 1 further comprising feedback means for feeding back at least a portion of said output digital signals from the output to the input of said non-linear transformation means.

14. A digital audio signal processor comprising:

digital signal memory means for storing complex digital signals having values representative of the instantaneous amplitudes of arbitrary complex input audio signals;

dynamic control means for selectively controlling on a real-time basis parameters of the digital signals stored in said digital signal memory means;

non-linear transformation means for translating on a real-time basis input digital signals from said digital signal memory in accordance with a pre-determined translation map to produce output digital signals having a predetermined amplitude for each specified input digital signal amplitude;

output means for transmitting output digital signals having values representative of the instantaneous amplitudes of arbitrary output audio signals, whereby arbitrary input audio signals are non-linearly modified by said non-linear transformation means and outputted in a form suitable for being reproduced in audible form.

15. A digital audio signal processor as defined in claim 14, further comprising a plurality of real-time input control devices; real-time control circuitry for selectively initiating the readout from said digital signal memory and controlling the addressing and output parameters in response to information from said real-time input control devices.

16. A digital signal processor as defined in claim 15, further comprising digital signal memory addressing means for said digital signal memory responsive to control from said controller; digital signal memory output processing means to modify data so addressed from said signal memory during playback in accordance with information from said controller; and output conversion means for converting data from said translation means into analog form as an analog audio output signal amplitude, whereby said audio input signals are processed and modified by said non-linear means prior to being outputted and reproduced in audible form.

17. A digital audio signal processor as defined in claim 14, wherein said non-linear transformation means has multiple inputs; and further comprising input conversion means for converting analog audio input signals into digital signals; and switch means for selectively connecting said non-linear transformation means to one of said digital signal memory and said input conversion means.

18. A digital audio signal processor as defined in claim 16, further comprising sampling control logic to address said digital signal memory during recording; multiplexor means for selecting addresses to said digital signal memory means from one of either said sampling control logic or said digital signal memory addressing means; and a digital audio output accumulator for summing the intermediate time-multiplexed outputs from said LUT to yield a final composite digital output.

19. A digital audio signal processor as defined in claim 18 comprising a digital signal processor (DSP) which replaces and performs the function(s) of at least one of the following elements; real-time control circuitry, digital signal memory addressing means; digital signal memory output processing means; sampling control logic; non-linear transformation means; multiplexor means; and digital audio output accumulator.

20. A digital audio signal processor as defined in either claim 4 or claim 14, further comprising interpolation means associated with said non-linear transformation means for interpolating digital signals to reduce distortions incurred by using a table of limited size.

21. A digital audio signal processor as defined in either claim 4 or claim 14, further comprising RMS measurement means for measuring the RMS values of said digital signals at the input and output of said non-linear transformation means; and digital gain control means to restore the RMS level of said digital output signal to that of the digital input signal.

22. A digital audio signal processor as defined in either claim 4 or claim 14, further comprising filtering means to alter spectral content of the digital signal at at least one of said input and output of said non-linear transformation means, said filtering means being responsive to said dyanmic control infromation from said input control devices.

23. A digital audio signal processor as defined in either claim 4 or claim 14, comprising a plurality of LUTS; and multiplexor means for LUT selection as a function of dynamic control information from said input control devices.

24. A digital audio signal processor as defined in either claim 4 or claim 14, wherein said LUT is segmented into a plurality of mapped areas; and shifting means for selection of a mapped area as a function of dynamic control information from said input control devices.

25. A digital audio signal processor as defined in claim 14 further comprising interpolation means for modifiying said digital signal memory with a combination of the current data in said memory and the transformed data output from said non-linear transformation means.

* * * * *

UNITED STATES PATENT AND TRADEMARK OFFICE
CERTIFICATE OF CORRECTION

PATENT NO. : 4,991,218

DATED : February 5, 1991

INVENTOR(S) : KRAMER, Gregory

It is certified that error appears in the above-identified patent and that said Letters Patent is hereby corrected as shown below:

Column 2, line 29    Change "polynominals." to --polynomials.--.

Column 23, line 3    Change "dyanmic" to --dynamic--;

Signed and Sealed this

Twenty-fourth Day of September, 1991

*Attest:*

HARRY F. MANBECK, JR.

*Attesting Officer*    *Commissioner of Patents and Trademarks*